(12) United States Patent
Chuang et al.

(10) Patent No.: US 7,646,533 B2
(45) Date of Patent: Jan. 12, 2010

(54) SMALL ULTRA-HIGH NA CATADIOPTRIC OBJECTIVE

(75) Inventors: Yung-Ho Chuang, Cupertino, CA (US); David R. Shafer, Fairfield, CT (US); J. Joseph Armstrong, Milpitas, CA (US)

(73) Assignee: KLA-Tencor Technologies Corporation, Milpitas, CA (US)

( * ) Notice: Subject to any disclaimer, the term of this patent is extended or adjusted under 35 U.S.C. 154(b) by 0 days.

(21) Appl. No.: 11/093,850

(22) Filed: Mar. 29, 2005

(65) Prior Publication Data

US 2006/0158720 A1 Jul. 20, 2006

Related U.S. Application Data

(63) Continuation-in-part of application No. 10/434,374, filed on May 7, 2003.

(60) Provisional application No. 60/449,326, filed on Feb. 21, 2003.

(51) Int. Cl.
*G02B 17/00* (2006.01)
(52) U.S. Cl. .................. 359/364; 359/726
(58) Field of Classification Search .................. None
See application file for complete search history.

(56) References Cited

U.S. PATENT DOCUMENTS

| | | | |
|---|---|---|---|
| 1,973,066 A | 9/1934 | Hauser et al. | |
| 2,432,668 A * | 12/1947 | Kingston | 264/2.4 |
| 2,661,658 A | 12/1953 | Dyson | |
| 3,237,515 A | 3/1966 | Altman | |
| 4,155,630 A | 5/1979 | Ih | |
| 4,511,220 A | 4/1985 | Scully | |
| 4,647,158 A | 3/1987 | Yeadon | |
| 4,758,088 A | 7/1988 | Doyle | |
| 4,779,966 A | 10/1988 | Friedman | |
| 4,795,244 A | 1/1989 | Uehara | |
| 4,898,471 A | 2/1990 | Vaught et al. | |
| 4,971,428 A | 11/1990 | Moskovich | |
| 4,974,094 A | 11/1990 | Morito | |
| 5,031,976 A | 7/1991 | Shafer | |
| 5,089,913 A | 2/1992 | Singh et al. | |
| 5,114,238 A | 5/1992 | Sigler | |

(Continued)

FOREIGN PATENT DOCUMENTS

DE           108181           1/1900

(Continued)

OTHER PUBLICATIONS

CVI Melles Griot Online Catalog. CaF2 Plano-Convex Lenses. <http://www.cvilaser.com/Catalog/Pages/Template2.aspx?pcid=160&filter=0>. Retrieved from the World Wide Web Apr. 16, 2009. p. 4.19.*

(Continued)

*Primary Examiner*—Stephone B Allen
*Assistant Examiner*—Derek S Chapel
(74) *Attorney, Agent, or Firm*—Smyrski Law Group, A P.C.

(57) ABSTRACT

A relatively high spectral bandwidth objective employed for use in imaging a specimen and method for imaging a specimen is provided. The objective includes a lens group having at least one focusing lens configured to receive light energy and form focused light energy. The focused light energy forms an intermediate image. The objective further includes at least one field lens located in proximity to an intermediate image, and a catadioptric arrangement positioned to receive the intermediate light energy from the at and form controlled light energy. The catadioptric arrangement may include at least one Mangin element and can include a meniscus lens element.

31 Claims, 13 Drawing Sheets

U.S. PATENT DOCUMENTS

| | | | |
|---|---|---|---|
| 5,140,459 | A | 8/1992 | Sagan |
| 5,162,939 | A | 11/1992 | Herron et al. |
| 5,177,559 | A | 1/1993 | Batchelder et al. |
| 5,233,460 | A | 8/1993 | Partlo |
| 5,264,912 | A | 11/1993 | Vaught et al. |
| 5,274,494 | A | 12/1993 | Rafanelli et al. |
| 5,309,456 | A | 5/1994 | Horton |
| 5,323,263 | A | 6/1994 | Schoenmakers |
| 5,337,170 | A | 8/1994 | Khoury et al. |
| 5,428,442 | A | 6/1995 | Lin et al. |
| 5,434,662 | A | 7/1995 | Rockwell et al. |
| 5,488,229 | A | 1/1996 | Elliott et al. |
| 5,515,207 | A | 5/1996 | Foo |
| 5,621,529 | A | 4/1997 | Gordon et al. |
| 5,636,066 | A | 6/1997 | Takahashi |
| 5,644,140 | A | 7/1997 | Biedermann et al. |
| 5,668,673 | A | 9/1997 | Suenaga et al. |
| 5,717,518 | A | 2/1998 | Shafer et al. |
| 5,729,374 | A | 3/1998 | Tiszauer et al. |
| 5,805,334 | A | 9/1998 | Takahashi |
| 5,805,357 | A | 9/1998 | Omura |
| 5,808,797 | A | 9/1998 | Bloom et al. |
| 5,808,805 | A | 9/1998 | Takahashi |
| 5,835,275 | A | 11/1998 | Takahashi et al. |
| 5,849,468 | A | 12/1998 | Sawyer |
| 5,851,740 | A | 12/1998 | Sawyer |
| 5,861,997 | A | 1/1999 | Takahashi |
| 5,880,891 | A | 3/1999 | Furter |
| 5,990,983 | A | 11/1999 | Hargis et al. |
| 5,999,310 | A | 12/1999 | Shafer et al. |
| 6,064,517 | A * | 5/2000 | Chuang et al. ............... 359/364 |
| 6,191,887 | B1 | 2/2001 | Michaloski et al. |
| 6,275,514 | B1 | 8/2001 | Katzir et al. |
| 6,370,178 | B1 | 4/2002 | Papayoanou et al. |
| 6,548,797 | B1 | 4/2003 | Ai |
| 6,842,298 | B1 * | 1/2005 | Shafer et al. ................ 359/730 |
| 6,898,024 | B2 * | 5/2005 | Takeuchi et al. ............ 359/719 |
| 2003/0117718 | A1 | 6/2003 | Takeuchi et al. |
| 2004/0095573 | A1 * | 5/2004 | Tsai et al. ................ 356/237.5 |

FOREIGN PATENT DOCUMENTS

| | | |
|---|---|---|
| DE | 3742806 A | 7/1989 |
| EP | 0798585 A2 | 10/1997 |
| GB | 2269024 A | 1/1994 |
| WO | WO 97/12226 | 4/1997 |
| WO | WO 99/08134 | 2/1999 |

OTHER PUBLICATIONS

CVI Melles Griot Online Catalog. Laser Quality Fused Silica Plano-Convex Lenses. <http://www.cvilaser.com/Catalog/Pages/Template2.aspx?pcid=164&filter=0>. Retrieved from the World Wide Web Apr. 16, 2009. pp. 4.14-4.16.*

CVI Melles Griot Online Catalog. Laser Quality Fused Silica Plano-Concave Lenses. <http://www.cvilaser.com/Catalog/Pages/Template2.aspx?pcid=157&filter=0>. Retrieve from the World Wide Web Apr. 16, 2009. pp. 4.42-4.43.*

CVI Melles Griot Online Catalog. UV MgF2 Bi-Convex Lenses. <http://www.cvilaser.com/Catalog/Pages/Template2.aspx?pcid=149&filter=0>. Retrieved from the World Wide Web Apr. 16, 2009. p. 4.34.*

CVI Melles Griot Online Catalog. Laser Quality Fused Silica Bi-Convex Lenses. <http://www.cvilaser.com/Catalog/Pages/Template2.aspx?pcid=150&filter=0>. Retrieved from the World Wide Web Apr. 16, 2009. pp. 4.32-4.33.*

CVI Melles Griot Online Catalog. Laser Quality Fused Silica Bi-Concave Lenses. <http://www.cvilaser.com/Catalog/Pages/Template2.aspx?pcid=147&filter=0>. Retrieved from the World Wide Web Apr. 16, 2009. p. 4.50.*

CVI Melles Griot Online Catalog. Positive Bestform Lenses. <http://www.cvilaser.com/Catalog/Pages/Template2.aspx?pcid=145&filter=0>. Retrieved from the World Wide Web Apr. 16, 2009. pp. 4.54-4.55.*

CVI Melles Griot Online Catalog. Meniscus Lenses. <http://www.cvilaser.com/Catalog/Pages/Template2.aspx?pcid=2026&filter=0>. Retrieved from the World Wide Web Apr. 16, 2009. pp. 4.56-4.58.*

CVI Melles Griot Online Catalog. Fused Silica Round Cylindrical Plano-Convex Singlet Lenses. <http://www.cvilaser.com/Catalog/Pages/Template2.aspx?pcid=172&filter=0>. Retrieved from the World Wide Web Apr. 16, 2009. p. 5.14.*

M.R. Bartz et al., "LED Print Analyzer," IBM Technical Disclosure Bulletin, vol. 14, No. 3, Aug. 1971.

J.L.C. Sanz et al., "Automated Visual Inspection with Dark-Field Microscopy," Journal of the Optical Society of America, Nov. 1985, USA, vol. 2, No. 11, pp. 1857-1862.

D.S. Goodman, "Darkfield Illuminator Attachment," IBM Technical Disclosure Bulletin, vol. 27, No. 5, Oct. 1984.

Carl Zeiss Brochure, "MSM 193 Microlithography Simulation Microscope," 1999.

* cited by examiner

SMALL ULTRA-HIGH NA CATADIOPTRIC OBJECTIVE

This application is a continuation-in-part of U.S. patent application Ser. No. 10/434,374, entitled "High Performance Catadioptric Imaging System," inventors David G. Shafer, et al., filed May 7, 2003, which claims the benefit of U.S. Provisional Patent Application Ser. No. 60/449,326, entitled "High Performance, Low Cost Catadioptric Imaging System," filed Feb. 21, 2003.

BACKGROUND OF THE INVENTION

1. Field of the Invention

The present invention relates generally to the field of optical imaging, and more specifically to catadioptric optical systems used for microscopic imaging, inspection, and lithography applications.

2. Description of the Related Art

Many optical systems have the ability to inspect or image features on the surface of a specimen, such as inspecting defects on a semiconductor wafer or photomask, or alternately examining a biological specimen on a slide. Microscopes have been used in various imaging situations, including biology, metrology, semiconductor inspection, and other complex inspection applications where high resolution images of small areas and/or features are desired.

Many such imaging systems are currently available, including those disclosed by applicants in various other issued patents and patent applications, including but not limited to U.S. patent application Ser. No. 10/434,374 and U.S. Pat. No. 6,064,517. The objective disclosed in the '374 application is a relatively small catadioptric objective exhibiting beneficial optical qualities. The small size catadioptric optical design of the '374 application exhibits generally good overall performance, particularly at high numerical apertures (NAs) over a relatively broad spectral range in the deep ultra-violet (DUV) region. However, chromatic correction can become increasingly difficult for light energy provided in the DUV region.

The objectives disclosed in the '517 patent are relatively large catadioptric objectives providing certain desirable optical qualities. The relatively large catadioptric optical designs in the '517 patent are generally corrected over a narrow spectral bandwidth and thus can be capable of performing ultra-high NA imaging over relatively large field sizes.

The small ultra-high NA designs presented in the '517 patent and the small broad band designs presented in the '374 application have certain similar advantageous qualities, including but not limited to their ability to be made from a single glass material. However, the lenses employed have different arrangements and are used in different ways to generally achieve different goals.

In using an inspection design for the applications discussed, it can be beneficial to improve the overall NA and field size of the system. Generally, the NA represents the range of angles for which light can be delivered to and collected from a specimen using the design. The field size is the diameter at the specimen location over which all the optical performance requirements are satisfied. For example, certain systems may successfully and efficiently employ ultra-high NA imaging over large field sizes. In this specific context, ultra-high NA illumination and imaging angles may include, but are not limited to, angles up to 76 degrees. Generally, previous designs have limitations of lower NAs, smaller field sizes, larger optical element diameters, or very tight manufacturing tolerances (i.e., lenses must be precisely crafted) in the high end applications discussed. All of these limitations can adversely affect overall performance and cost of the system.

Based on the optical characteristics desirable in such a design, an ultra-high NA and large field can offer improved capabilities when inspecting specimens using light energy in the DUV range. For example, but not by way of limitation, operation at wavelengths of 193, 213, 244, 257, 266, 325, 355 or greater up through visible wavelengths may result in beneficial performance in certain circumstances. In addition, relatively small size and relatively loose manufacturing tolerances can provide advantages over previous designs.

It would therefore be beneficial to provide a system and objective for use in conjunction with standard microscopes and microscopy applications that overcome the foregoing drawbacks present in previously known imaging systems. Further, it would be beneficial to provide an optical inspection system design having improved functionality over devices exhibiting the negative aspects described herein.

SUMMARY OF THE INVENTION

According to one aspect of the present design, there is provided an ultra-high numerical aperture objective for use in imaging a specimen. The objective comprises a lens group comprising at least one focusing lens configured to receive light energy and form focused light energy. The focused light energy forms an intermediate image. The objective further comprises at least one field lens located in proximity to an intermediate image, and a catadioptric arrangement positioned to receive the intermediate light energy from the at and form controlled light energy, wherein the catadioptric arrangement comprises at least one Mangin element and at least one meniscus lens element.

According to another aspect of the present design, there is provided an ultra-high numerical aperture objective for use in imaging a specimen. The objective comprises a plurality of lenses configured to receive light energy and convert the light energy into an intermediate image, at least one field lens located in proximity to the intermediate image configured to receive the intermediate image and provide field imaged light energy, and a catadioptric group configured to receive the field imaged light energy and apply relatively low aberration energy to the specimen, wherein at least one meniscus field lens is positioned between the intermediate image and the catadioptric group.

These and other advantages of the present invention will become apparent to those skilled in the art from the following detailed description of the invention and the accompanying drawings.

DESCRIPTION OF THE DRAWINGS

The present invention is illustrated by way of example, and not by way of limitation, in the figures of the accompanying drawings in which.

DETAILED DESCRIPTION OF THE INVENTION

Figure 1:
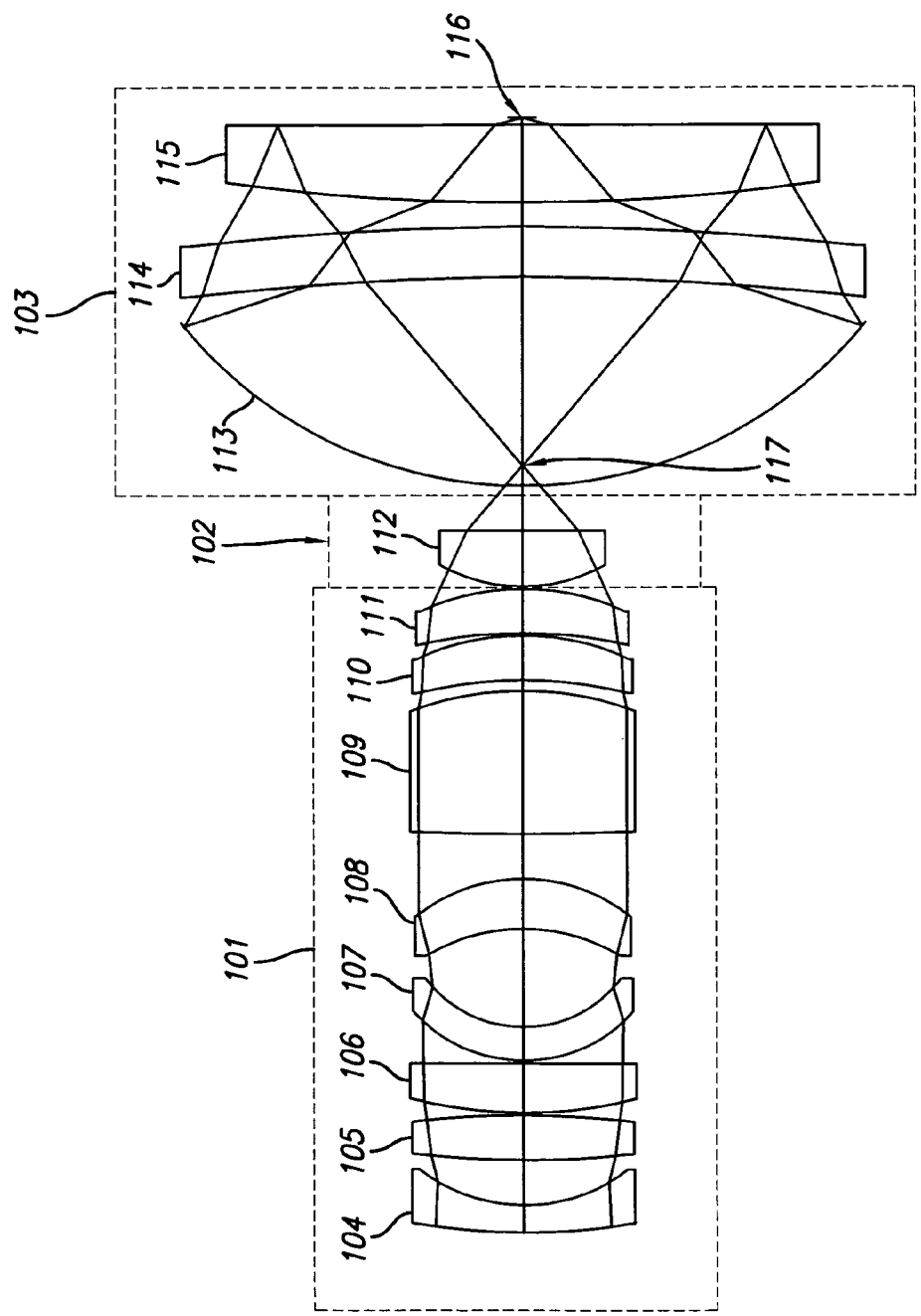
FIG. 1 presents a twelve element objective with a 0.97 NA having a field size of approximately 0.8 mm and a meniscus lens element inside the catadioptric group curved toward the spherical mirror.

According to the present invention, there is provided a small catadioptric objective having an ultra-high numerical aperture, exhibiting a relatively large field, small size, and loose tolerances for use in advanced applications such as microscopy and semiconductor inspection. The small ultra-high NA objective may be employed in a variety of dark field and bright field imaging schemes. The present design is capable of delivering and collecting light at angles up to 76 degrees from the sample normal.

The present invention may be used and optimized for receipt of light energy or light beams exhibiting varying wavelengths, such as from the infrared to the deep ultraviolet. For example, in the ultraviolet spectrum, light beams having wavelengths of 193 nm, 213 nm, 244 nm, 248 nm, 257 nm, 266 nm, and so forth may be successfully employed using the concepts disclosed herein, with adjustments that would be apparent to those of ordinary skill in the art. For wavelengths from 110-200 nm, fluoride glasses may be used due to their advantageous transmission properties.

The present design facilitates a catadioptric optical system having high quality imaging performance at numerical apertures (NAs) up to 0.97. This NA range represents the capability to illuminate and image at very high angles of incidence. The relationship between the numerical aperture in air and the angle of incidence to the sample is:

$$NA = n * \sin(\text{angle of incidence}) \quad (1)$$

where the index n has a value of 1.000 for air. The following table summarizes the relation between NA and the angle of incidence in air:

| NA (in air) | Angle of incidence (degrees) |
|---|---|
| 0.90 | 64 |
| 0.91 | 66 |
| 0.92 | 67 |
| 0.93 | 68 |
| 0.94 | 70 |
| 0.95 | 72 |
| 0.96 | 74 |
| 0.97 | 76 |

In general, the present invention may comprise lenses formed from a single glass material, but more than one glass material may be employed. In UV-DUV applications, fused silica can be employed due to its beneficial transmission properties. In addition, fused silica also has adequate thermal stability and is relatively easy to polish.

The present invention changes the catadioptric group of lenses employed. Previous small broad band designs have relatively limited NAs and field sizes compared to the present design, where field size in this arrangement represents the size of the area on the specimen that can be imaged the system with minimum degradation in optical performance. Limitations in NA and field size result from the need for net refractive power in the catadioptric group to be negative to correct for primary axial color in the focusing lens group. The present design uses narrow band light so axial color compensation is unnecessary. Use of narrow band light allows the refractive portion of the catadioptric group to exhibit a zero or positive net power. In previous designs, the group of field lenses can image the catadioptric group into the focusing lenses to correct for lateral color. In the present design, a similar type of imaging is performed by a group of field lenses, but the imaging and energy received at the field lenses can be used to control monochromatic aberrations such as high-order spherical aberration and coma.

Previous large catadioptric ultra-high NA designs have decenter tolerances that are relatively tight and make manufacturing very difficult. Relatively tight decenter tolerances in this environment can be caused by the steep angles of incidence of the focusing lenses. Previous lensing designs can require high angles of incidence in order to provide the required level of high-order spherical aberration and coma necessary to compensate for aberrations generated within the catadioptric group of lenses. In the present design, the group of focusing lenses reduces decenter tolerances to reduce high-order aberrations in the catadioptric group of lenses. In this arrangement, the group of focusing lenses does not need to compensate for high-order spherical aberration.

Reduction of high order aberrations has not been achievable using a simple catadioptric group of lenses having one or two Mangin element(s). Generally acceptable results can be achieved for either higher-order spherical aberration or for higher-order coma, but not both at once using a relatively simple catadioptric group of lenses.

The present design uses different design approaches for the catadioptric group of lenses. One design approach uses a three element catadioptric group of lenses in combination with a spherical mirror, a lens used in triple-pass, and a Mangin element near the specimen or wafer.

FIG. 1 illustrates one embodiment according to the present design. The design comprises a focusing lens group 101, a field lens group 102, and a catadioptric group 103. The focusing lens group 101 includes lenses 104-111. Light energy is received from the left side of FIG. 1. Intermediate image 117 is formed by focusing lens group 101. The design further includes field lens 112 between the focusing lens group 101 and intermediate image 117. The intermediate image 117 is formed in proximity to the vertex of the spherical mirror 113 in catadioptric group 103. The catadioptric group 103 comprises three elements including a spherical mirror 113, lens element 114 used in triple pass, and a mangin element 115. The three element arrangement for the catadioptric group 103 places the lens 114 between the spherical mirror 113 and the Mangin element 115. This lens 114 is shaped as a meniscus element toward the spherical mirror.

Table 1 presents the lens prescriptions for the embodiment illustrated in FIG. 1.

TABLE 1

Lens Prescriptions for the design of FIG. 1

| Surf | Radius | Thickness | Glass |
|---|---|---|---|
| OBJ | Infinity | Infinity | |
| 1 | 25.245 | 1.250 | Fused Silica |
| 2 | 7.348 | 2.000 | |
| 3 | 40.258 | 2.000 | Fused Silica |
| 4 | −42.215 | 0.100 | |
| 5 | 19.413 | 2.250 | Fused Silica |
| 6 | −655.879 | 0.100 | |
| 7 | 6.345 | 1.499 | Fused Silica |
| 8 | 5.264 | 4.413 | |
| 9 | −8.330 | 2.241 | Fused Silica |
| 10 | −7.445 | 2.000 | |
| 11 | 107.690 | 6.435 | Fused Silica |
| 12 | −14.353 | 0.500 | |
| 13 | −19.543 | 2.000 | Fused Silica |
| 14 | −11.311 | 0.100 | |
| 15 | −21.046 | 2.000 | Fused Silica |
| 16 | −10.797 | 0.100 | |
| 17 | 7.342 | 2.500 | Fused Silica |
| 18 | −154.636 | 1.999 | |
| 19 | Infinity | 9.271 | |
| 20 | −132.032 | 2.250 | Fused Silica |
| 21 | −135.713 | 1.053 | |
| 22 | 91.236 | 3.466 | Fused Silica |
| 23 | Infinity | −3.466 | MIRROR |
| 24 | 91.236 | −1.053 | |
| 25 | −135.713 | −2.250 | Fused Silica |
| 26 | −132.032 | −9.271 | |
| 27 | 19.013 | 9.271 | MIRROR |
| 28 | −132.032 | 2.250 | Fused Silica |
| 29 | −135.713 | 1.053 | |
| 30 | 91.236 | 3.466 | Fused Silica |
| 31 | Infinity | 0.000 | |
| 32 | Infinity | 0.300 | |
| IMA | Infinity | | |

As may be appreciated by one skilled in the art, the numbers in the leftmost column of Table 1 represent the surface number counting surfaces from the left of FIG. 1. For example, the left surface of lens 104 in the orientation presented in FIG. 1 (surface 1 in Table 1) has a radius of curvature of 25.245 mm, a thickness of 1.25 mm, and the rightmost surface (surface 2) has a radius of curvature of −7.348 mm, and is 2.0 mm from the next surface. The material used is fused silica.

In the design presented in FIG. 1, the numerical aperture may approach or even exceed approximately 0.97 in air. From FIG. 1, the focusing lens group 101 has the ability to receive light energy and transmit focused light energy. The field lens group 102 has the ability to receive the focused light energy and provide intermediate light energy, and form intermediate image 117. The catadioptric group or Mangin mirror arrangement 103 receives the intermediate energy and provides controlled light energy to the specimen (not shown) at focal point 116. Alternately, the reflected path originates at the specimen, and light reflected from the specimen is received by the catadioptric group or Mangin mirror arrangement 103 and forms and transmits reflected light energy. The field lens group 102 receives the reflected light energy and transmitting resultant light energy, and the focusing lens group receives resultant light energy and transmits focused resultant light energy. An aperture or mask can be placed at the aperture stop (not shown) to limit or modify the NA of the objective.

The design presented in FIG. 1 and Table 1 thus uses a single glass material, fused silica. Other materials may be employed, but fused silica or any material used within the design may require low absorption over the range of wavelengths supported by the objective design. Fused silica offers relatively high transmission properties for light energy from 190 nm through the infrared wavelengths. Because of the single material design of the ultra-high NA objective, fused silica can enable the design to be re-optimized for any center wavelength in this wavelength range. For example, the design can be optimized for use with lasers at 193, 198.5, 213, 244, 248, 257, 266, 308, 325, 351, 355, or 364 nm. In addition, if calcium fluoride is employed as a glass or lens material, the design can be employed with an excimer laser operating at 157 nm. Re-optimization can require a slight tuning or altering of components, and may generally be within the abilities of those skilled in the art.

Figure 13:
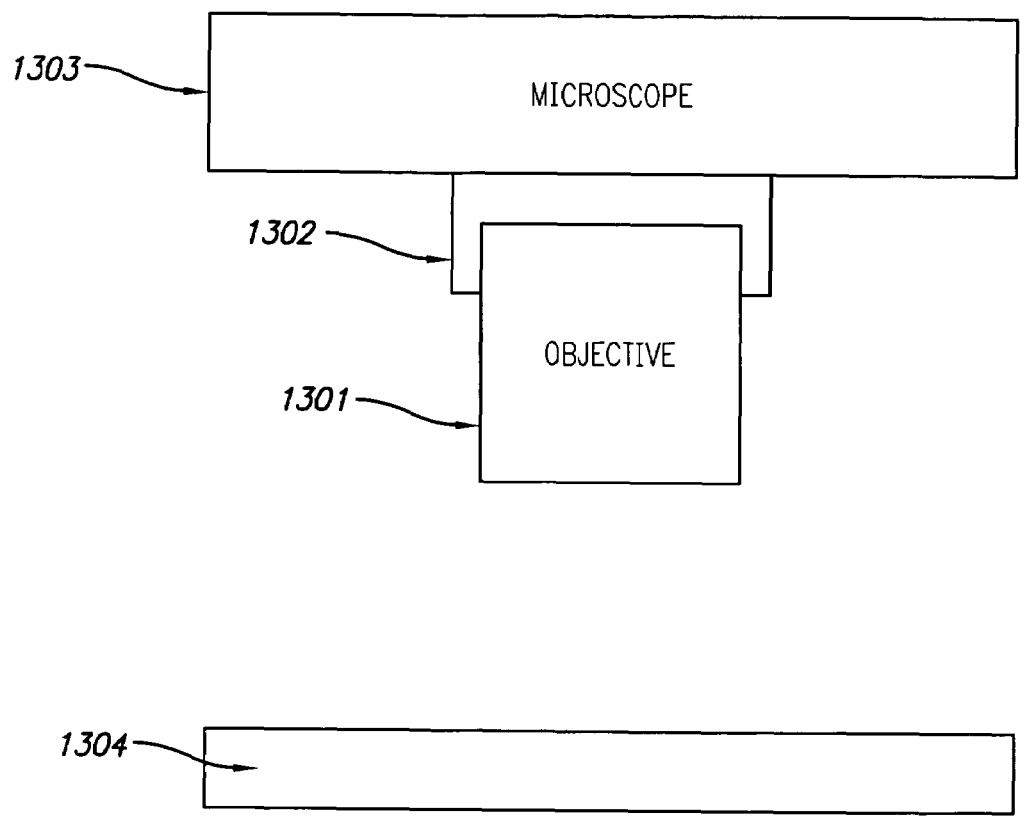
FIG. 13 represents a microscope and use of an objective conforming to the present design in a general microscope design.

The design of FIG. 1 operates in the presence of light energy at a 266 nm wavelength and exhibits a field size of approximately 0.8 mm. The maximum element diameter is 30 mm, significantly smaller than many objective designs previously employed in this wavelength range. As a result, the objective can be mounted in a standard microscope turret with an approximate 45 mm flange-to-object separation. A general microscope design is illustrated in FIG. 13, with objective 1301, flange 1302, and microscope turret 1303 shown in addition to object or specimen 1304. The components of FIG. 13 are generalized and not to scale.

The ultra-high NA objective of FIG. 1 and Table 1 can support a numerical aperture of approximately 0.97 in air and a polychromatic wavefront error of less than approximately 0.045 waves. The three element catadioptric arrangement 103 allows the objective to simultaneously achieve desired performance goals using relatively loose tolerances. The highest sensitivity to a 10 micron element decenter in the focusing group 101 is approximately 0.36 waves at 266 nm without compensation. The sensitivity to a 10 micron element decenter for the field lens group 102 is approximately 0.32 waves at 266 nm without compensation. The highest sensitivity to a 10 micron element decenter for the catadioptric group 103 is approximately 0.4 waves at 266 nm without compensation. Generally speaking, the wavefront error from any 10 micron element decenter in such an arrangement may be less than lambda/2 and in certain cases may be less than lambda/3.

As is true with any optical design, certain tradeoffs may be made to improve performance characteristics depending on the desired application of the objective or optical design. It is possible, for example, to sacrifice bandwidth, field size, numerical aperture, and/or objective size to enhance one of the aforementioned performance characteristics, depending on the application. For example, optimizing for lower or higher NAs is possible. Reducing the NA can reduce the manufacturing tolerance and the outer diameter of the objective. Lower NA designs can provide larger field sizes and larger bandwidths. Lower NA designs exhibiting similar performance using fewer optical elements are also possible. Optimizing the optical elements to increase NA is also possible, but can limit the resultant field size or bandwidth, and may require slightly increased diameter objective elements.

The design of FIG. 1 is self corrected, where self corrected in this context means that the objective does not require any additional optical components to correct aberrations in order to achieve inspection design specifications. In other words, no additional components are needed to provide a generally aberration free image, or the objective provides substantially complete images without need for additional compensation. The ability to self correct can provide for simpler optical testing metrology and optical alignment to other self corrected imaging optics. Further correction of residual aberrations using additional imaging optics is also possible, where further correction can increase the optical specifications, including but not limited to bandwidth or field size.

The ultra-high NA objective design presented herein can support various modes of illumination and imaging. Modes supported can include bright field and a variety of dark field illumination and imaging modes. Other modes such as confocal, differential interference contrast, polarization contrast may also be supported using the present design.

Bright field mode is commonly used in microscope systems. The advantage of bright field illumination is the clarity of the image produced. Using bright field illumination with an objective such as that presented herein provides a relatively accurate representation of object feature size multiplied by the magnification of the optical system. The objective and optical components presented herein can be used with image comparison and processing algorithms for computerized object detection and classification. Bright field mode typically uses a broad band incoherent light source, but laser illumination sources can be used with slightly modified illumination system components while employing the objective design presented herein.

The confocal mode is used for optical sectioning to resolve height differences between object features. Most imaging modes have difficulty detecting feature height changes. The confocal mode forms separate images of object features at each height of interest. Comparison of the images then shows the relative heights of different features. Confocal mode may be employed using the objective designs presented herein.

Dark field mode has been used to detect features on objects. The advantage of the dark field mode is that flat specular areas scatter very little light toward the detector, resulting in a dark image. Surface features or objects protruding above the object tend to scatter light toward the detector. Thus, in inspecting objects like semiconductor wafers, dark field imaging produces an image of features, particles, or other irregularities on a dark background. The present design may be employed with dark field mode illumination. Dark field mode provides a large resultant signal upon striking small features that scatter light. This large resultant signal allows larger pixels to be employed for a given feature size, permitting faster object inspections. Fourier filtering can also be used to minimize the repeating pattern signal and enhance the defect signal to noise ratio during dark field inspection.

Many different dark field modes exist, each including a specific illumination and collection scheme. Illumination and collection schemes can be chosen such that the scattered and diffracted light collected from the object provides an acceptable signal-to-noise ratio. Certain optical systems use different dark field imaging modes including ring dark field, laser directional dark field, double dark field, and central dark ground. Each of these dark field imaging modes may be employed in the present design.

Any of the above mentioned imaging modes may be efficiently employed with the imaging design of FIG. 1, albeit where slight modifications to certain components may offer improvements to certain performance parameters. In any configuration, the imaging objective design presented enables inspection in any of the named imaging modes with the result of a relatively high numerical aperture operation over a broad wavelength spectrum, with relatively high field size. The design can operate within a standard microscope turret and offers imaging performance better than that previously known.

Figure 2:
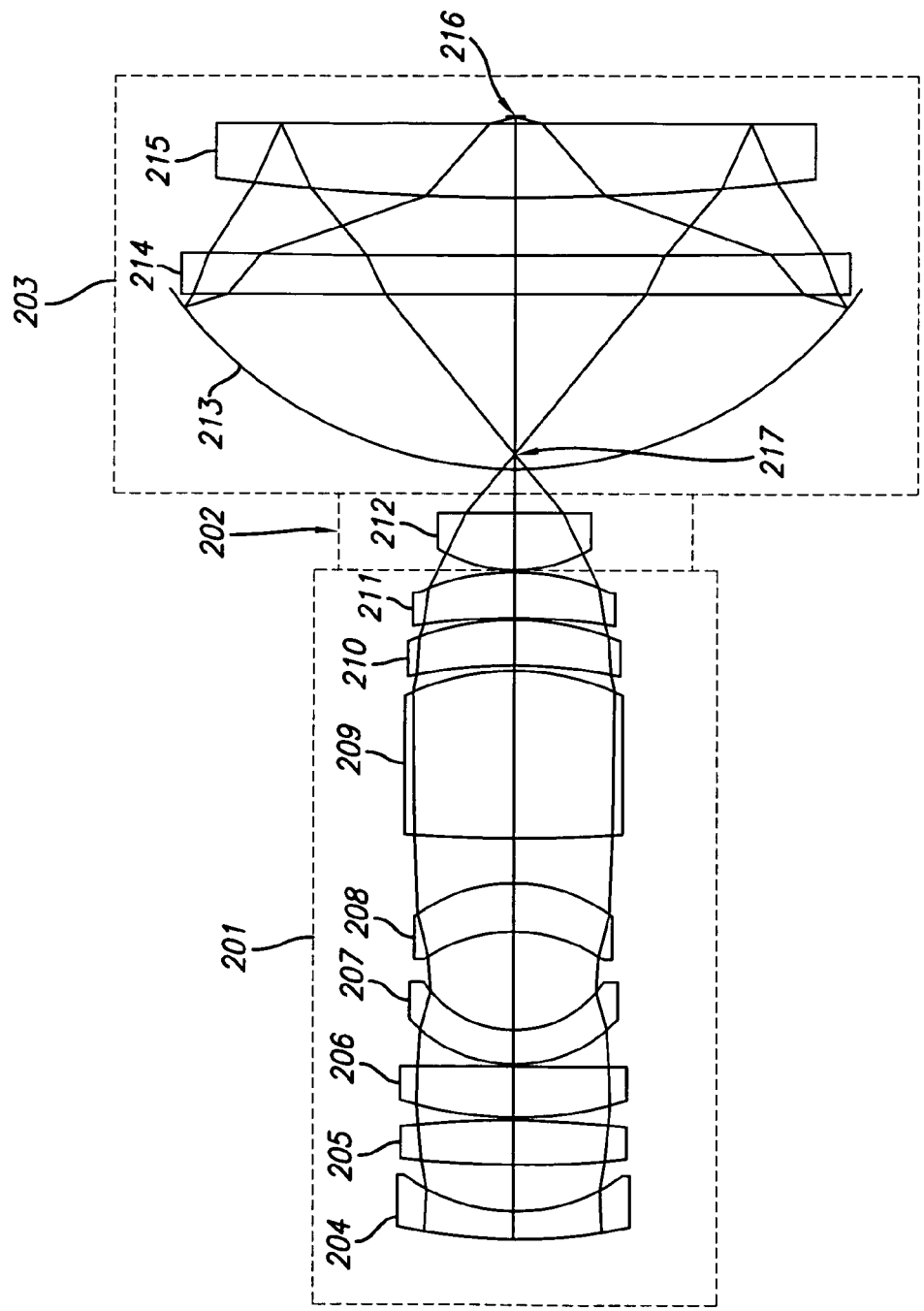
FIG. 2 illustrates a twelve element objective with a 0.97 NA having a field size of approximately 0.8 mm and a meniscus lens element inside the catadioptric group curved away from the spherical mirror.

FIG. 2 illustrates an alternate embodiment according to the present design with twelve separate elements. The design of FIG. 2 presents a different arrangement for elements in the catadioptric group of elements. The arrangement of FIG. 2 provides a lens between the spherical mirror and the Mangin element, has nearly zero power, and is shaped as a meniscus element away from the spherical mirror. The meniscus lens can be a parallel plate in this arrangement.

The design of FIG. 2 comprises a focusing lens group 201, a field lens group 202, and a catadioptric group 203. The focusing lens group 201 includes lenses 204-211. Intermediate image 217 is formed by first lens group 201. The design further includes field lens 212 between the focusing lens group 201 and the intermediate image 217. The intermediate image 217 is formed in proximity to the vertex of the spherical mirror 213 in catadioptric group 203. The catadioptric group comprises three elements including a spherical mirror 213, lens element 214 used in triple pass, and a mangin element 215. The three element arrangement for the catadioptric group 103 places the lens 214 between the spherical mirror 213 and the Mangin element 215. This lens in this arrangement is shaped as a meniscus element away from the spherical mirror.

Table 2 presents the lens prescriptions for the embodiment illustrated in FIG. 2.

TABLE 2

Lens Prescriptions for the Design of FIG. 2

| Surf | Radius | Thickness | Glass |
| --- | --- | --- | --- |
| OBJ | Infinity | Infinity | |
| 1 | 25.374 | 1.250 | Fused Silica |
| 2 | 8.125 | 2.000 | |
| 3 | 41.565 | 2.000 | Fused Silica |
| 4 | −36.440 | 0.100 | |
| 5 | 16.212 | 2.250 | Fused Silica |
| 6 | −1030.800 | 0.100 | |
| 7 | 6.235 | 1.499 | Fused Silica |
| 8 | 4.762 | 4.330 | |
| 9 | −7.052 | 2.132 | Fused Silica |
| 10 | −7.219 | 2.000 | |
| 11 | 70.545 | 7.418 | Fused Silica |
| 12 | −11.249 | 0.240 | |
| 13 | −22.306 | 2.000 | Fused Silica |
| 14 | −12.059 | 0.100 | |
| 15 | −26.291 | 2.000 | Fused Silica |
| 16 | −10.592 | 0.100 | |
| 17 | 6.747 | 2.500 | Fused Silica |
| 18 | 183.418 | 1.999 | |
| 19 | Infinity | 7.652 | |
| 20 | Infinity | 1.671 | Fused Silica |
| 21 | 1133.100 | 2.539 | |
| 22 | 104.408 | 3.263 | Fused Silica |
| 23 | Infinity | −3.263 | MIRROR |
| 24 | 104.408 | −2.539 | |
| 25 | 1133.100 | −1.671 | Fused Silica |
| 26 | Infinity | −7.652 | |
| 27 | 18.236 | 7.652 | MIRROR |
| 28 | Infinity | 1.671 | Fused Silica |
| 29 | 1133.100 | 2.539 | |
| 30 | 104.408 | 3.263 | Fused Silica |
| 31 | Infinity | 0.000 | |

TABLE 2-continued

Lens Prescriptions for the Design of FIG. 2

| Surf | Radius | Thickness | Glass |
|---|---|---|---|
| 32 | Infinity | 0.300 | |
| IMA | Infinity | | |

In the design presented in FIG. 2, the numerical aperture may approach or even exceed approximately 0.97 in air. From FIG. 2, the focusing lens group 201 has the ability to receive light energy and transmit focused light energy. The field lens group 202 has the ability to receive the focused light energy and provide intermediate light energy, and form intermediate image 217. The catadioptric group or Mangin mirror arrangement 203 receives the intermediate energy and provides controlled light energy to the specimen (not shown) at focal point 216. Alternately, such as in dark field mode, the reflected path originates at the specimen, and light reflected from the specimen is received by the catadioptric group or Mangin mirror arrangement 203 and forms and transmits reflected light energy. The field lens group 202 receives the reflected light energy and transmits resultant light energy, and the focusing lens group receives resultant light energy and transmits focused resultant light energy. An aperture or mask can be placed at the aperture stop (not shown) to limit or modify the NA of the objective.

The design of FIG. 2 operates at a 355 nm wavelength and has a field size of approximately 0.8 mm. The maximum element diameter is 28 mm, significantly smaller than many objective designs previously employed in this wavelength range. The small size of this objective is particularly beneficial in view of the performance characteristics of the objective. One technique available for evaluating and specifying the performance characteristics of the present designs' objective is to use a polychromatic Strehl ratio (PSR). PSR is generally known to provide a comparison of the peak intensity at the detection plane of an imaging system from a localized polychromatic source to the theoretical maximum peak intensity of an ideal imaging system operating at the diffraction limit and is stated in the form of a ratio. As a result, the objective can be mounted in a standard microscope turret with an approximate 45 mm flange-to-object separation. This ultra-high NA objective supports a numerical aperture of approximately 0.97 in air and a wavefront error of less than approximately 0.039 waves.

The three element catadioptric arrangement 203 allows the objective to simultaneously achieve the above performance goals with relatively loose tolerances. The highest sensitivity to a 10 micron element decenter in the focusing group 201 is approximately 0.287 waves at 355 nm without compensation. The sensitivity to a 10 micron element decenter for the field lens group 202 is approximately 0.267 waves at 355 nm without compensation. The highest sensitivity to a 10 micron element decenter for the catadioptric group 203 is 0.246 waves at 355 nm without compensation.

The design presented in FIG. 2 and Table 2 uses a single glass material, fused silica. Other materials may be employed in a similar fashion to the design presented in FIG. 1. The design can be re-optimized depending on desired performance. Re-optimization for other wavelengths requires slight tuning or altering of components, and may generally be within the abilities of those skilled in the art. The design of FIG. 2 is self corrected in a similar fashion to the design of FIG. 1. Also, the ultra-high NA objective design presented herein can support various modes of illumination and imaging as is shown with the objective in FIG. 1.

Figure 3:
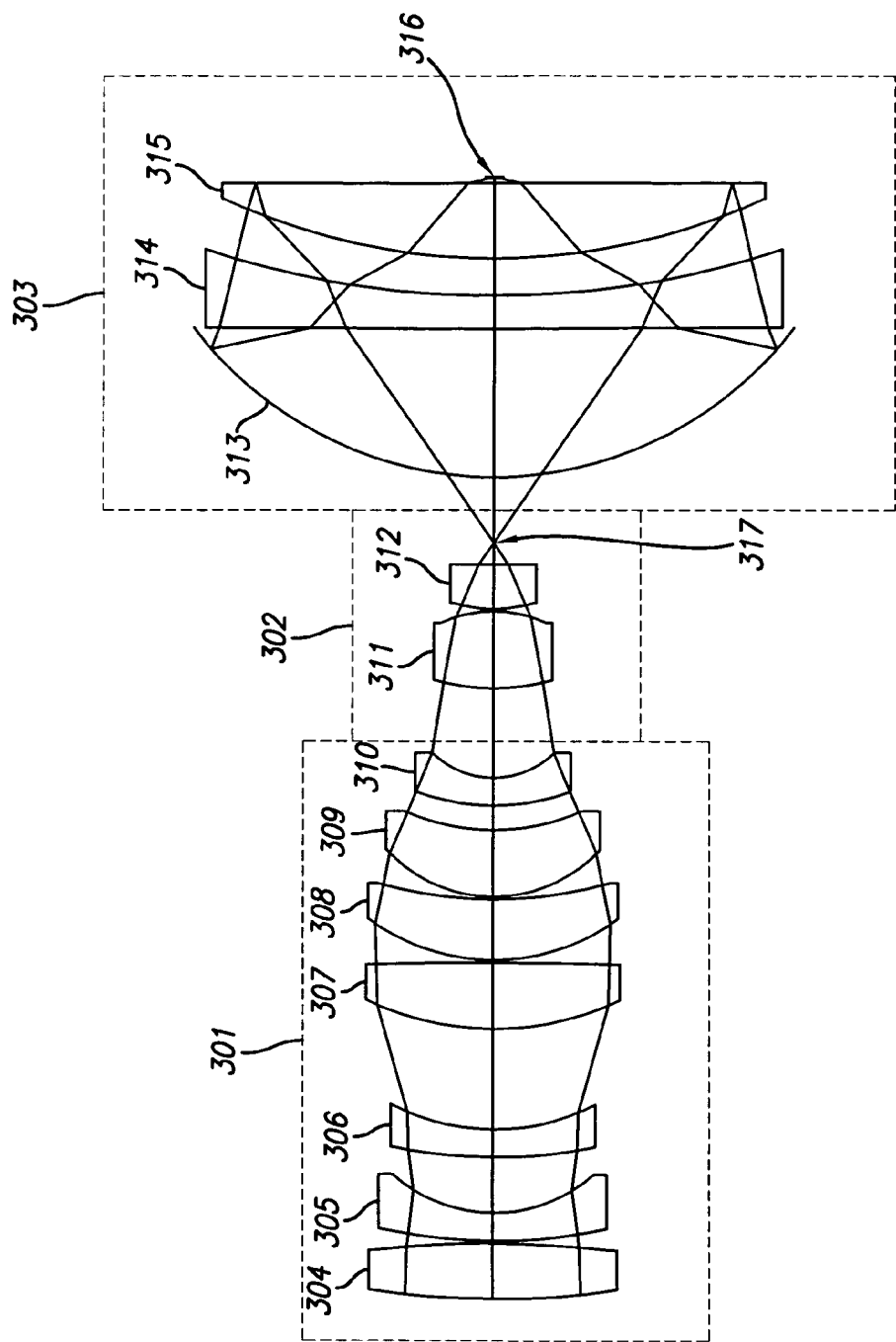
FIG. 3 is a twelve element objective with a 0.97 NA having a field size of approximately 0.8 mm and a negative lens element inside the catadioptric group.

FIG. 3 illustrates an alternate embodiment according to the present design with twelve separate elements. This design has a different arrangement for the elements in the catadioptric group. This arrangement has the lens between the spherical mirror and the Mangin element is shaped as a negative element.

The design comprises a focusing lens group 301, a field lens group 302, and a catadioptric group 303. The focusing lens group 301 includes lenses 304-311. Intermediate image 317 is formed by first lens group 301. The design further includes field lenses 311 and 312 between the focusing lens group 301 and the intermediate image 317. The intermediate image 317 is formed in proximity to the vertex of the spherical mirror 313 in catadioptric group 303. The catadioptric group comprises three elements including a spherical mirror 313, lens element 314 used in triple pass, and a mangin element 315. The three element arrangement for the catadioptric group 303 again places the lens 314 between the spherical mirror 313 and the Mangin element 315. This lens is shaped as a negative element.

Table 3 presents the lens prescriptions for the embodiment illustrated in FIG. 3.

TABLE 3

Lens Prescriptions for the Design of FIG. 3

| Surf | Radius | Thickness | Glass |
|---|---|---|---|
| OBJ | Infinity | Infinity | |
| 1 | 35.572 | 2.500 | Fused Silica |
| 2 | −42.996 | 0.100 | |
| 3 | 22.702 | 1.250 | Fused Silica |
| 4 | 6.601 | 2.500 | |
| 5 | 22.179 | 1.250 | Fused Silica |
| 6 | 9.777 | 4.529 | |
| 7 | 12.902 | 3.000 | Fused Silica |
| 8 | −166.609 | 0.100 | |
| 9 | 9.209 | 2.750 | Fused Silica |
| 10 | 19.323 | 0.100 | |
| 11 | 6.418 | 3.000 | Fused Silica |
| 12 | 9.660 | 1.095 | |
| 13 | 9.920 | 1.249 | Fused Silica |
| 14 | 3.831 | 4.074 | |
| 15 | 9.999 | 3.464 | Fused Silica |
| 16 | −5.505 | 0.100 | |
| 17 | 6.407 | 2.000 | Fused Silica |
| 18 | 130.998 | 2.000 | |
| 19 | Infinity | 1.903 | |
| 20 | Infinity | 6.651 | |
| 21 | 1145.400 | 1.500 | Fused Silica |
| 22 | 41.017 | 1.657 | |
| 23 | 28.492 | 3.353 | Fused Silica |
| 24 | Infinity | −3.353 | MIRROR |
| 25 | 28.492 | −1.657 | |
| 26 | 41.017 | −1.500 | Fused Silica |
| 27 | 1145.400 | −6.651 | |
| 28 | 16.492 | 6.651 | MIRROR |
| 29 | 1145.400 | 1.500 | Fused Silica |
| 30 | 41.017 | 1.657 | |
| 31 | 28.492 | 3.353 | Fused Silica |
| 32 | Infinity | 0.300 | |
| IMA | Infinity | | |

In the design presented in FIG. 3, the numerical aperture may approach or even exceed approximately 0.97 in air. From FIG. 3, the focusing lens group 301 has the ability to receive light energy and transmit focused light energy. The field lens group 302 has the ability to receive the focused light energy and provide intermediate light energy, and form intermediate image 317. The catadioptric group or Mangin mirror arrangement 303 receives the intermediate energy and provides controlled light energy to the specimen (not shown) at focal point 316. Alternately, the reflected path originates at the specimen, and light reflected from the specimen is received by the catadioptric group or Mangin mirror arrangement 303 and forms and transmits reflected light energy. The field lens group 302 receives the reflected light energy and transmits resultant light energy, and the focusing lens group receives resultant light energy and transmits focused resultant light energy. An aperture or mask can be placed at the aperture stop (not shown) to limit or modify the NA of the objective.

The design of FIG. 3 operates at a 266 nm wavelength and has a field size of approximately 0.8 mm. The maximum element diameter is 26 mm, again significantly smaller than many objective designs previously employed in this wavelength range. The small size of this objective is particularly beneficial in view of the performance characteristics of the objective. As a result, the objective can be mounted in a standard microscope turret with an approximate 45 mm flange-to-object separation. This ultra-high NA objective supports a numerical aperture of approximately 0.97 in air and a wavefront error of less than approximately 0.039 waves.

The three element catadioptric group or catadioptric arrangement 303 provides relatively loose tolerances in the focusing lens group 301 and field lens group 302. The highest sensitivity to a 10 micron element decenter in the focusing group 301 is approximately 0.26 waves at 266 nm without compensation. The sensitivity to a 10 micron element decenter for the field lens group 302 is approximately 0.33 waves at 266 nm without compensation. The catadioptric group 303 for this configuration has tighter decenter tolerances. The highest sensitivity to a 10 micron element decenter for the catadioptric group 303 is approximately 0.72 waves at 266 nm without compensation.

The design presented in FIG. 3 and Table 3 uses a single glass material, fused silica. Other materials may be employed in a similar fashion to the design presented in FIG. 1. Re-optimization for other wavelengths may require slight tuning or altering of components, and may generally be within the abilities of those skilled in the art. The design of FIG. 3 is self corrected in a similar fashion to the design of FIG. 1. Also, the ultra-high NA objective design presented herein can support various modes of illumination and imaging in a manner similar to the design of FIG. 1.

Figure 4:
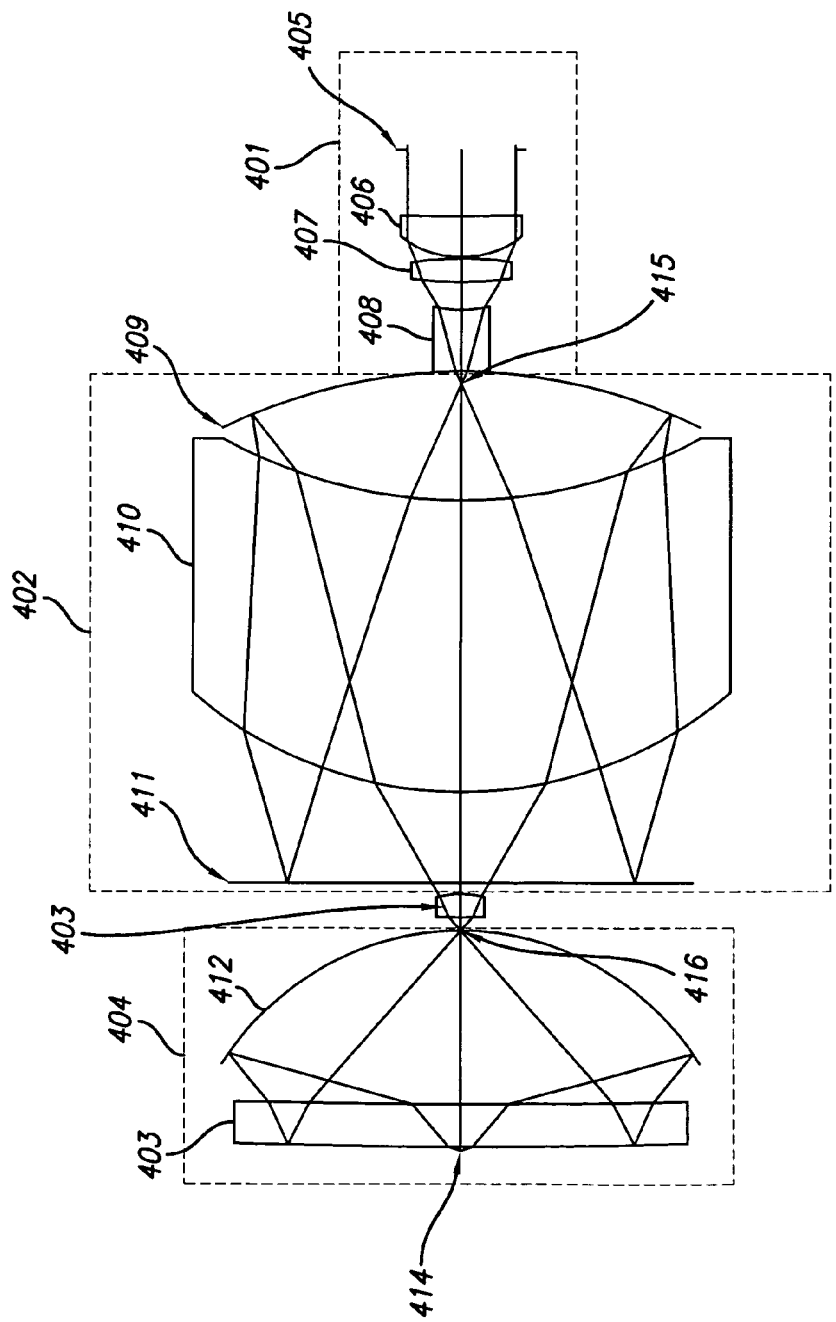
FIG. 4 presents a nine element objective with a 0.97 NA in accordance with the present design having a field size of approximately 0.8 mm and two catadioptric groups.

FIG. 4 illustrates an alternate embodiment according to the present design with nine separate elements. This design has a different arrangement for the elements in the catadioptric group of elements, having two catadioptric cavities. One cavity is used to compensate for the high order aberrations in the other cavity. This effectively loosens the tolerances of the focusing lens group and field lens group.

The design of FIG. 4 comprises a focusing lens group 401, a field lens group 403, and two catadioptric groups 402 and 404. The focusing lens group 401 includes lenses 406, 407, and 408. A first intermediate image 415 is formed by first lens group 401. A first catadioptric group 402 is comprised of three elements with lens 410 positioned between the spherical mirror 409 and a nominally flat element 411. The design further includes field lens 403 between the first catadioptric group 402 and the second catadioptric group 404. The intermediate image 416 is formed in proximity to the vertex of the spherical mirror 412 in catadioptric group 404. The catadioptric group 404 comprises two elements including a spherical mirror 412 and a mangin element 413. In this design the mirror surfaces 412 and 411 can be fabricated on opposite sides of the same element. Using this fabrication process, the field lens 403 will be positioned substantially inside the central hole in the element. An external pupil 405 is available in this design.

Table 4 presents the lens prescriptions for the embodiment illustrated in FIG. 4.

TABLE 4

Lens Prescriptions for the Design of FIG. 4

| Surf | Radius | Thickness | Glass |
| --- | --- | --- | --- |
| OBJ | Infinity | 0.300 | |
| 1 | 698.747 | 3.658 | Fused Silica |
| 2 | 818.577 | 14.717 | |
| 3 | −23.366 | −14.717 | MIRROR |
| 4 | 818.577 | −3.658 | Fused Silica |
| 5 | 698.747 | 3.658 | MIRROR |
| 6 | 818.577 | 14.717 | |
| 7 | Infinity | 1.200 | |
| 8 | 11.644 | 2.000 | Fused Silica |
| 9 | −8.049 | 0.800 | |
| 10 | Infinity | 7.923 | |
| 11 | 34.030 | 25.000 | Fused Silica |
| 12 | 40.672 | 10.991 | |
| 13 | −44.837 | −10.991 | MIRROR |
| 14 | 40.672 | −25.000 | Fused Silica |
| 15 | 34.030 | −7.923 | |
| 16 | 1215.700 | 7.923 | MIRROR |
| 17 | 34.030 | 25.000 | Fused Silica |
| 18 | 40.672 | 10.991 | |
| 19 | 9.929 | 5.185 | Fused Silica |
| 20 | 8.354 | 2.380 | |
| 21 | 30.185 | 2.000 | Fused Silica |
| 22 | −27.207 | 0.100 | |
| 23 | 7.989 | 3.500 | Fused Silica |
| 24 | 246.131 | 5.623 | |
| STO | Infinity | 0.000 | |
| IMA | Infinity | | |

In the design presented in FIG. 4, the numerical aperture may approach or even exceed approximately 0.97 in air. From FIG. 4, the focusing lens group 401 has the ability to receive light energy and transmit focused light energy and form intermediate image 415. The catadioptric group 402 has the ability to take light from intermediate image 415 and form a second intermediate image 416. The field lens group 403 can receive the focused light energy and provide intermediate light energy as well as aid in the formation of intermediate image 416. The catadioptric group 104 receives the intermediate energy from 416 and provides controlled light energy to the specimen (not shown) at focal point 414. Alternately, the reflected path originates at the specimen, and light reflected from the specimen is received by the catadioptric group or Mangin mirror arrangement 404 and forms and transmits reflected light energy. The field lens group 403 receives the reflected light energy and transmitting resultant light energy, and the first catadioptric group receives intermediate light energy and forms an alternate intermediate light energy. The focusing lens group receives resultant light energy and transmits focused resultant light energy. An aperture or mask can be placed at the aperture stop 405 to limit or modify the NA of the objective.

The design of FIG. 4 operates at a 266 nm wavelength and has a field size of approximately 0.8 mm. The maximum element diameter is 40 mm. This ultra-high NA objective supports a numerical aperture of approximately 0.97 in air and a polychromatic wavefront error of less than approximately 0.05 waves.

The double catadioptric group arrangement again provides relatively loose tolerances. The highest sensitivity to a 10 micron element decenter in the focusing group 401 is approximately 0.61 waves at 266 nm without compensation.

The highest sensitivity to a 10 micron element decenter for the first catadioptric group 402 is approximately 0.54 waves at 266 nm without compensation. The sensitivity to a 10 micron element decenter for the field lens group 403 is approximately 0.54 waves at 266 nm without compensation, while the highest sensitivity to a 10 micron element decenter for the second catadioptric group 404 is approximately 0.77 waves at 266 nm without compensation.

The design presented in FIG. 4 and Table 4 uses a single glass material, fused silica. Other materials may be employed in a similar fashion to the design presented in FIG. 1. Re-optimization for other wavelengths requires slight tuning or altering of components, and may generally be within the abilities of those skilled in the art. The design of FIG. 4 is self corrected in a similar fashion to the design of FIG. 1. Also, the ultra-high NA objective design presented herein can support various modes of illumination and imaging similar to the objective of FIG. 1.

Figure 5:
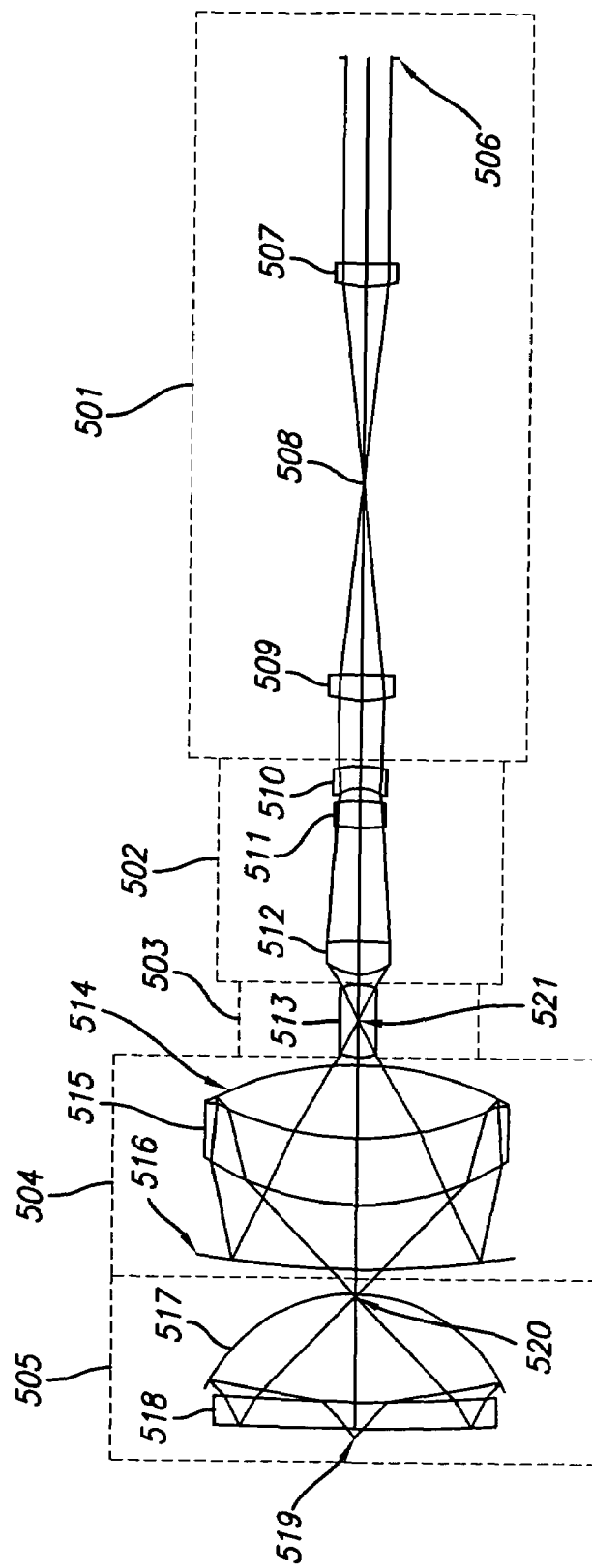
FIG. 5 illustrates a nine element objective with a 0.97 NA having a field size of approximately 0.4 mm and two catadioptric groups with an additional two element pupil relay.

FIG. 5 illustrates an alternate embodiment according to the present objective design with nine separate elements and the addition of a two element pupil relay. This design has yet another arrangement of elements in the catadioptric group. The design of FIG. 5 has two catadioptric cavities in a similar configuration to the design in FIG. 4. One cavity is used to compensate for high order aberrations in the other cavity. This arrangement tends to loosen focusing lens group and field lens group tolerances. Removal of the field lens between the two catadioptric groups tends to simplify manufacturing.

The design of FIG. 5 comprises a pupil relay group 501, a focusing lens group 502, a field lens group 503, and two catadioptric groups 504 and 505. The pupil relay group 501 comprises lenses 507 and 509. This lens group effectively creates an external pupil 506. A first intermediate image 508 is formed between lens elements 507 and 509. The focusing lens group 502 includes lenses 510, 511, and 512. A second intermediate image 521 is formed by first lens group 502. The design further includes field lens 513 between field lens group 502 and the first catadioptric group 504. The second intermediate image 521 is located in proximity to field lens 513. A first catadioptric group 504 is comprised of three elements and positions the lens 515 between the spherical mirror 514 and a nominally flat mirror 516. The third intermediate image 520 is formed in proximity to the vertex of the spherical mirror 517 in catadioptric group 505. The catadioptric group 505 comprises two elements including a spherical mirror 517 and a mangin element 518. Mirror surfaces 516 and 517 can be fabricated on opposite sides of the same element.

Table 5 presents the lens prescriptions for the embodiment illustrated in FIG. 5.

TABLE 5

Lens Prescriptions for the Design of FIG. 5

| Surf | Radius | Thickness | Glass |
|---|---|---|---|
| OBJ | Infinity | 0.300 | |
| 1 | 687.224 | 3.968 | Fused Silica |
| 2 | 267.813 | 16.129 | |
| 3 | −24.383 | −16.129 | MIRROR |
| 4 | 267.813 | −3.968 | Fused Silica |
| 5 | 687.224 | 3.968 | MIRROR |
| 6 | 267.813 | 16.129 | |
| 7 | Infinity | 3.735 | |
| 8 | Infinity | 9.573 | |
| 9 | 40.125 | 9.963 | Fused Silica |
| 10 | 45.955 | 11.000 | |
| 11 | −47.474 | −11.000 | MIRROR |
| 12 | 45.955 | −9.963 | Fused Silica |

TABLE 5-continued

Lens Prescriptions for the Design of FIG. 5

| Surf | Radius | Thickness | Glass |
|---|---|---|---|
| 13 | 40.125 | −9.573 | |
| 14 | 150.981 | 9.573 | MIRROR |
| 15 | 40.125 | 9.963 | Fused Silica |
| 16 | 45.955 | 11.000 | |
| 17 | Infinity | 1.144 | |
| 18 | 7.494 | 11.030 | Fused Silica |
| 19 | −7.208 | 1.555 | |
| 20 | 7.278 | 5.000 | Fused Silica |
| 21 | −43.167 | 16.949 | |
| 22 | 47.873 | 4.000 | Fused Silica |
| 23 | −18.878 | 2.000 | |
| 24 | −5.663 | 3.200 | Fused Silica |
| 25 | −15.600 | 10.020 | |
| 26 | 16.919 | 4.000 | Fused Silica |
| 27 | −65.271 | 57.934 | |
| 28 | 18.789 | 3.500 | Fused Silica |
| 29 | −106.552 | 30.490 | |
| IMA | Infinity | | |

In the design presented in FIG. 5, the numerical aperture may approach or even exceed approximately 0.97 in air. From FIG. 5, the pupil relay group has the ability to receive light energy from pupil location 506 and transmit relayed pupil energy to focusing lens group 502. Focusing lens group 502 has the ability to receive light energy and transmit focused light energy and form intermediate image 521. Field lends 513 is located in proximity to intermediate image 521 and can receive and transmit focused light energy. The catadioptric group 504 receives light from intermediate image 521 and can form a second intermediate image 520. The catadioptric group 505 receives the intermediate energy from 520 and provides controlled light energy to the specimen 519. Alternately, the reflected path originates at the specimen 519, and light reflected from the specimen is received by the catadioptric group or Mangin mirror arrangement 505 and forms and transmits reflected light energy. The first catadioptric group 504 then receives intermediate light energy and forms the alternate intermediate light energy 521. The field lens 513 is located in proximity to intermediate image 513. The focusing lens group receives resultant intermediate light energy and transmits light energy to pupil relay group 501. Pupil relay group 501 is capable of receiving light energy from the focusing lens group 502 and forming pupil 506. An aperture or mask can be placed at the aperture stop 506 to limit or modify the NA of the objective.

The design of FIG. 5 operates at a 266 nm wavelength and has a field size of approximately 0.4 mm. The maximum element diameter is 44 mm which is significantly smaller than many objective designs previously employed in this wavelength range. The small size of this objective is particularly beneficial in view of the performance characteristics of the objective. This ultra-high NA objective supports a numerical aperture of approximately 0.97 in air and a polychromatic wavefront error of less than approximately 0.05 waves.

This "double catadioptric group" arrangement provides a highest sensitivity to a 10 micron element decenter in the pupil relay group 501 and focusing group 502 of approximately 1.32 waves at 266 nm without compensation. The highest sensitivity to a 10 micron decenter for the field lens group 503 is approximately 1.2 waves at 266 nm without compensation. The highest sensitivity to a 10 micron element decenter for the first catadioptric group 504 is approximately 0.34 waves at 266 nm without compensation. The highest sensitivity to a 10 micron element decenter for the second catadioptric group 505 is approximately 0.76 waves at 266 nm without compensation.

Again, the design presented in FIG. 5 and Table 5 uses a single glass material, fused silica. Other materials may be employed in a similar fashion to the design presented in FIG. 1. Re-optimization for other wavelengths requires slight tuning or altering of components, and may generally be within the abilities of those skilled in the art. The design of FIG. 5 is self corrected in a similar fashion to the design of FIG. 1. Also, the ultra-high NA objective design presented herein can support various modes of illumination and imaging as the objective in FIG. 1.

Figure 6:
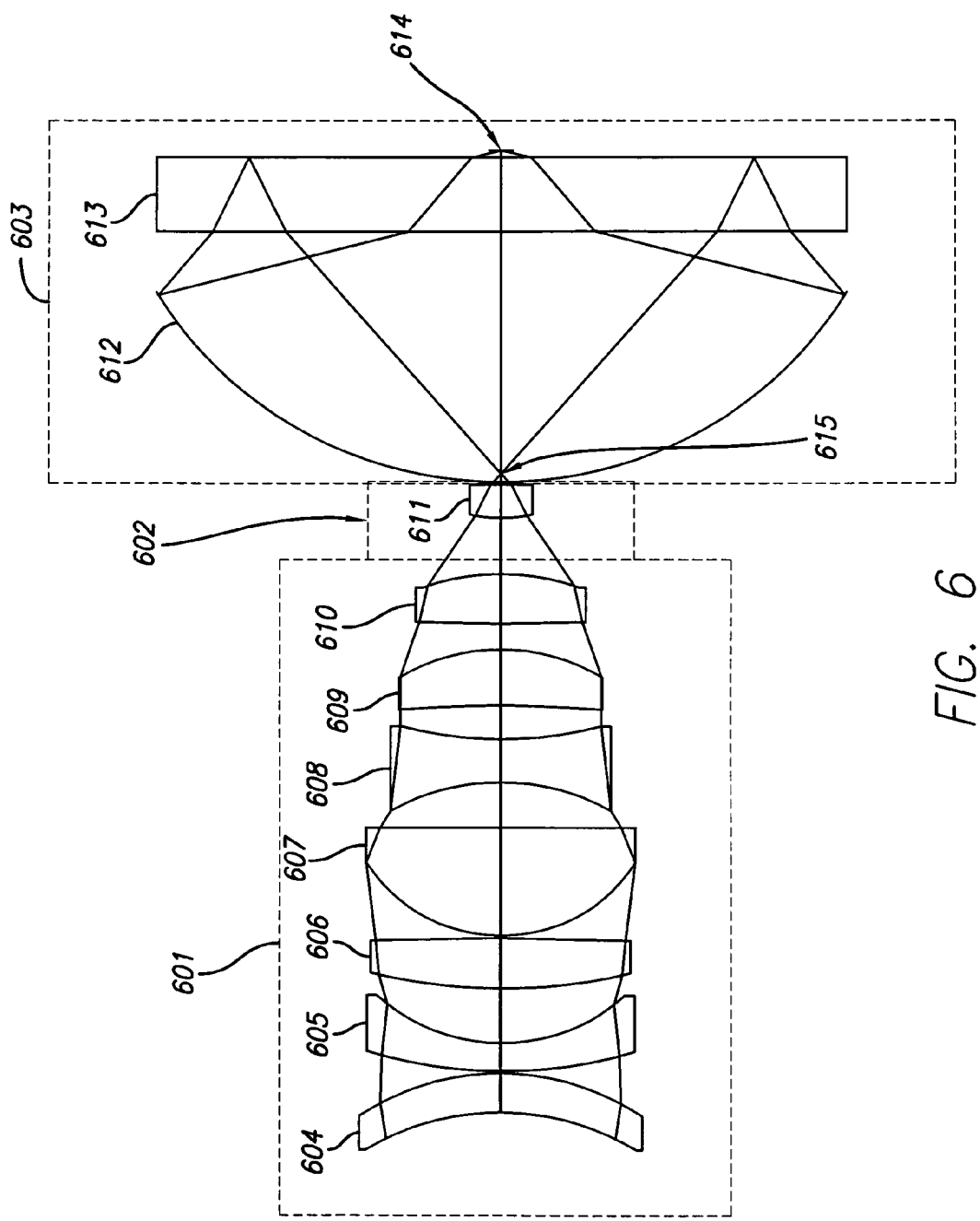
FIG. 6 is a ten element objective with a 0.97 NA having a field size of approximately 0.8 mm where the spherical mirror is a first surface mirror.

FIG. 6 illustrates an alternate embodiment according to the present design with ten separate elements. This design has an arrangement for the elements in the catadioptric group similar to previous ultra-high NA designs and is comprised of a hemispherical mirror and a nearly flat mangin element.

The design comprises a focusing lens group 601, a field lens group 602, and a catadioptric group 603. The focusing lens group 601 includes lenses 604-610. The design further includes a field lens 611 between the focusing lens group 601 and the catadioptric group 603. The intermediate image 615 is formed in proximity to the vertex of the spherical mirror 612 in catadioptric group 603. The catadioptric group 603 comprises two elements including a spherical mirror 612 and a mangin element 613.

Table 6 presents the lens prescriptions for the embodiment illustrated in FIG. 6.

| Surf | Radius | Thickness | Glass |
|---|---|---|---|
| OBJ | Infinity | Infinity | |
| 1 | −11.450 | 1.750 | Fused Silica |
| 2 | −11.005 | 0.100 | |
| 3 | 19.669 | 1.250 | Fused Silica |
| 4 | 7.857 | 2.438 | |
| 5 | 23.444 | 2.250 | Fused Silica |
| 6 | −115.385 | 0.100 | |
| 7 | 6.876 | 4.750 | Fused Silica |
| 8 | 199.699 | 2.077 | |
| 9 | −9.742 | 1.957 | Fused Silica |
| 10 | 16.600 | 1.500 | |
| 11 | −49.662 | 2.500 | Fused Silica |
| 12 | −8.430 | 1.167 | |
| 13 | 85.029 | 2.204 | Fused Silica |
| 14 | −9.795 | 2.514 | |
| 15 | 5.839 | 1.500 | Fused Silica |
| 16 | −49.062 | 0.100 | |
| 17 | Infinity | 11.098 | |
| 18 | Infinity | 3.288 | Fused Silica |
| 19 | Infinity | −3.288 | MIRROR |
| 20 | Infinity | −11.098 | |
| 21 | 17.517 | 11.098 | MIRROR |
| 22 | Infinity | 3.288 | Fused Silica |
| 23 | Infinity | 0.300 | |
| IMA | Infinity | | |

In the design presented in FIG. 6, the numerical aperture may approach or even exceed approximately 0.97 in air. From FIG. 6, the focusing lens group 601 has the ability to receive light energy and transmit focused light energy. The field lens group 602 has the ability to receive the focused light energy and provide intermediate light energy, and form intermediate image 615. The catadioptric group or Mangin mirror arrangement 603 receives the intermediate energy and provides controlled light energy to the specimen 614. Alternately, the reflected path originates at the specimen 614, and light reflected from the specimen is received by the catadioptric group or Mangin mirror arrangement 603 and forms and transmits reflected light energy. The field lens group 602 receives the reflected light energy and transmitting resultant light energy, and the focusing lens group receives resultant light energy and transmits focused resultant light energy. An aperture or mask can be placed at the aperture stop (not shown) to limit or modify the NA of the objective.

The design of FIG. 6 operates at a 266 nm wavelength and has a field size of approximately 0.8 mm. The maximum element diameter is 30 mm. The objective can be mounted in a standard microscope turret with an approximate 45 mm flange-to-object separation. This ultra-high NA objective supports a numerical aperture of approximately 0.97 in air and a polychromatic wavefront error of less than approximately 0.05 waves.

The highest sensitivity to a 10 micron element decenter in the focusing group 601 is approximately 1.19 waves at 266 nm without compensation. The sensitivity to a 10 micron element decenter for the field lens group 602 is approximately 0.56 waves at 266 nm without compensation. The highest sensitivity to a 10 micron element decenter for the catadioptric group 603 is approximately 0.60 waves at 266 nm without compensation. While some of these tolerances are quite tight compared to the embodiments in FIGS. 1 and 2, it still represents a reduction in size over prior ultra-high NA designs.

The design presented in FIG. 6 and Table 6 thus uses a single glass material, fused silica. Other materials may be employed in a similar fashion to the design presented in FIG. 1. Re-optimization for other wavelengths requires slight tuning or altering of components, and may generally be within the abilities of those skilled in the art. The design of FIG. 6 is again self corrected. Also, the ultra-high NA objective design presented herein can support various modes of illumination and imaging in a manner similar to the objective in FIG. 1.

Figure 7:
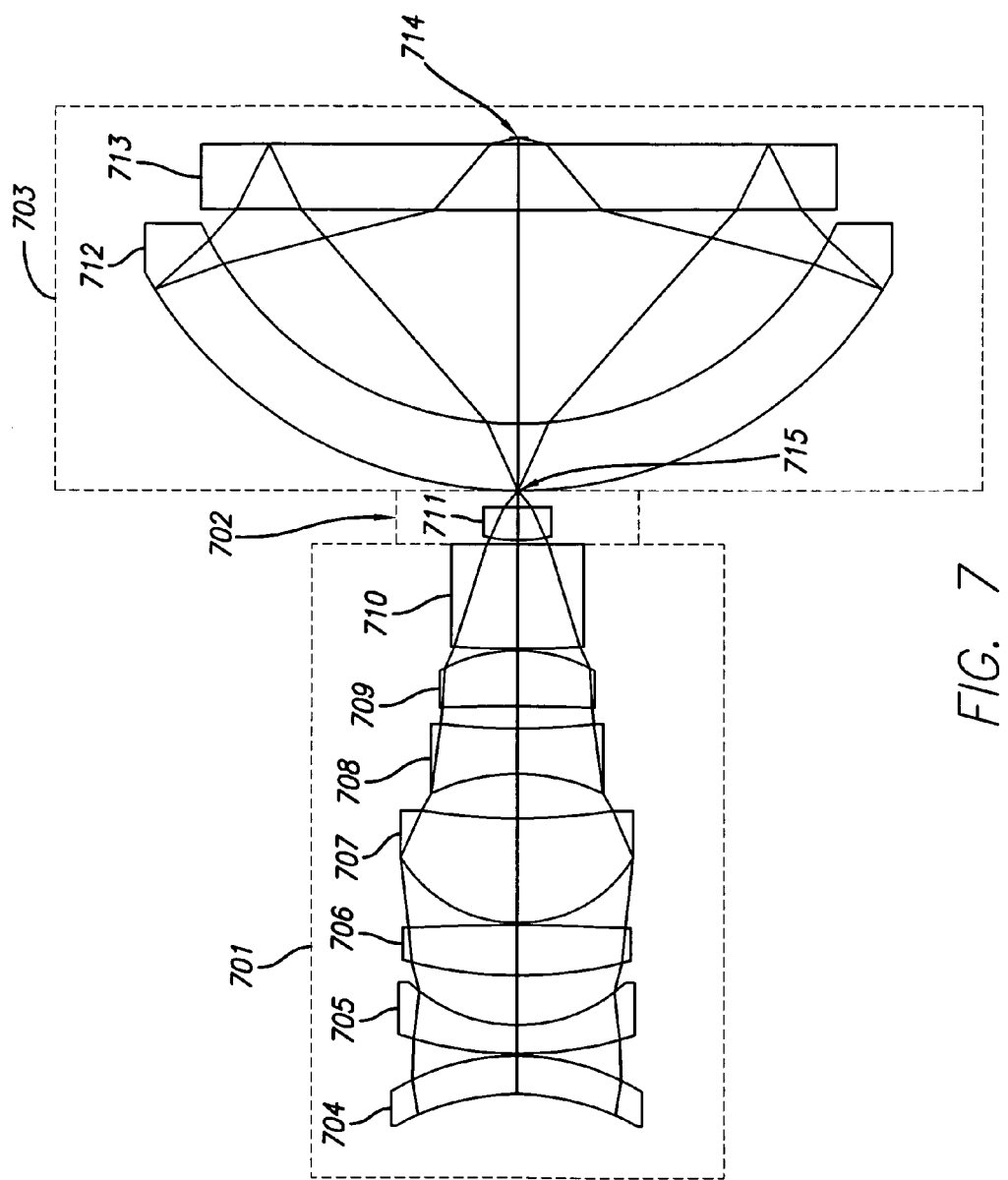
FIG. 7 presents a ten element objective with a 0.97 NA having a field size of approximately 0.8 mm where the spherical mirror in a lens mirror element.

FIG. 7 illustrates an alternate embodiment according to the present design with ten separate elements. This design employs an arrangement similar to previous ultra-high NA designs presented. The design of FIG. 7 is comprised of a hemispherical mangin element and a nearly flat mangin element.

The design comprises a focusing lens group 701, a field lens group 702, and a catadioptric group 703. The focusing lens group 701 includes lenses 704-710. The design further includes a field lens 711 between the focusing lens group 701 and the catadioptric group 703. The intermediate image 715 is formed in proximity to the vertex of the spherical mirror 712 in catadioptric group 703. The catadioptric group 703 comprises two elements including a spherical mirror 712 and a mangin element 713.

Table 7 presents the lens prescriptions for the embodiment illustrated in FIG. 7.

| Surf | Radius | Thickness | Glass |
|---|---|---|---|
| OBJ | Infinity | Infinity | |
| 1 | −10.748 | 1.750 | Fused Silica |
| 2 | −10.296 | 0.100 | |
| 3 | 16.951 | 1.250 | Fused Silica |
| 4 | 6.906 | 2.264 | |
| 5 | 19.613 | 2.250 | Fused Silica |
| 6 | −100.418 | 0.100 | |
| 7 | 5.920 | 4.750 | Fused Silica |
| 8 | 27.645 | 2.000 | |
| 9 | −8.506 | 2.034 | Fused Silica |
| 10 | 31.143 | 1.000 | |
| 11 | −79.261 | 2.500 | Fused Silica |
| 12 | −6.882 | 0.100 | |
| 13 | 66.383 | 4.816 | Fused Silica |

-continued

| Surf | Radius | Thickness | Glass |
|---|---|---|---|
| 14 | −15.089 | 0.100 | |
| 15 | 5.928 | 1.500 | Fused Silica |
| 16 | −31.712 | 0.750 | |
| 17 | 18.796 | 3.000 | Fused Silica |
| 18 | 15.402 | 9.575 | |
| 19 | 1765.900 | 2.938 | Fused Silica |
| 20 | Infinity | −2.938 | MIRROR |
| 21 | 1765.900 | −9.575 | |
| 22 | 15.402 | −3.000 | Fused Silica |
| 23 | 18.796 | 3.000 | MIRROR |
| 24 | 15.402 | 9.575 | |
| 25 | 1765.900 | 2.938 | Fused Silica |
| 26 | Infinity | 0.300 | |
| IMA | Infinity | | |

In the design presented in FIG. 7, the numerical aperture may approach or even exceed approximately 0.97 in air. From FIG. 7, the focusing lens group 701 has the ability to receive light energy and transmit focused light energy. The field lens group 702 has the ability to receive the focused light energy and provide intermediate light energy, and form intermediate image 715. The catadioptric group or Mangin mirror arrangement 703 receives the intermediate energy and provides controlled light energy to the focal point 714 and specimen (not shown). Alternately, the reflected path originates at the specimen, and light reflected from the specimen is received by the catadioptric group or Mangin mirror arrangement 703 and forms and transmits reflected light energy. The field lens group 702 receives the reflected light energy and transmitting resultant light energy, and the focusing lens group receives resultant light energy and transmits focused resultant light energy. An aperture or mask can be placed at the aperture stop (not shown) to limit or modify the NA of the objective.

The design of FIG. 7 operates at a 266 nm wavelength and has a field size of approximately 0.8 mm. The maximum element diameter is 32 mm and, as a result, the objective can be mounted in a standard microscope turret with an approximate 45 mm flange-to-object separation. This ultra-high NA objective supports a numerical aperture of approximately 0.97 in air and a polychromatic wavefront error of less than approximately 0.04 waves.

The highest sensitivity to a 10 micron element decenter in the focusing group 701 is approximately 1.2 waves at 266 nm without compensation. The sensitivity to a 10 micron element decenter for the field lens group 702 is approximately 0.55 waves at 266 nm without compensation. The highest sensitivity to a 10 micron element decenter for the catadioptric group 703 is approximately 0.52 waves at 266 nm without compensation. While some of these tolerances are relatively tight compared to the embodiments in FIGS. 1 and 2, the design of FIG. 7 represents a general reduction in size over prior ultra-high NA designs.

The design presented in FIG. 7 and Table 7 uses a single glass material, fused silica. Other materials may be employed in a similar fashion to the design presented in FIG. 1. Re-optimization for other wavelengths requires slight tuning or altering of components, and may generally be within the abilities of those skilled in the art. The design of FIG. 7 is self corrected in a manner similar to the design of FIG. 1. Also, the ultra-high NA objective design presented herein can support various modes of illumination and imaging as the objective in FIG. 1.

Figure 8:
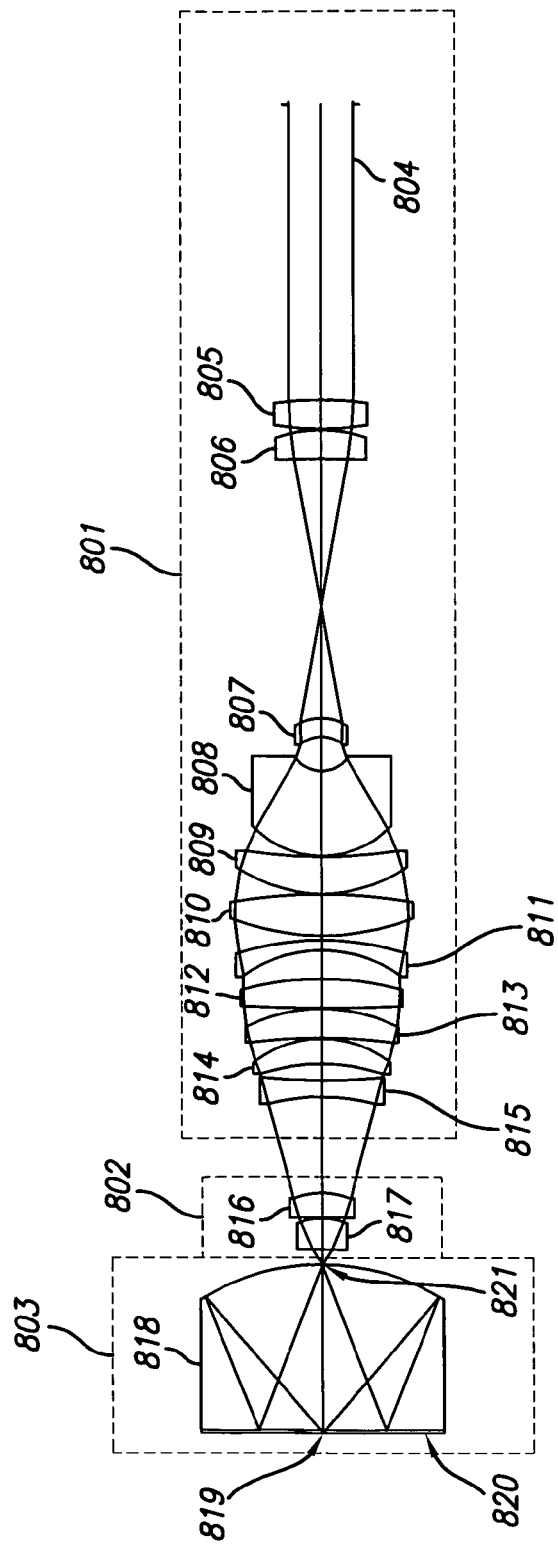
FIG. 8 is a fourteen element objective with a 0.97 NA having a field size of approximately 0.4 mm using a solid catadioptric element for immersion applications.

FIG. 8 illustrates an alternate embodiment according to the present design with fourteen separate elements. This design is designed to achieve an ultra high NA of 0.97 in an immersion imaging scheme. The design of FIG. 8 has a relatively large field size for such an immersion design.

The design comprises a focusing lens group 801, a field lens group 802, and a catadioptric group 803. The focusing lens group 801 includes lenses 805-815. The design further includes field lenses 816 and 817 between the focusing lens group 801 and the catadioptric group 803. The intermediate image 821 is formed in proximity to the vertex of the Mangin element 818 in catadioptric group 803. The catadioptric group 803 comprises a single uniformly formed Mangin element 818 having two reflective surfaces adjacent a single piece of glass. In other words, Mangin element 818 comprises a solid element having two reflective Mangin surfaces formed adjacent a single piece of glass. Use of a solid Mangin element as the catadioptric group presents advantages for immersion imaging at ultra-high NA.

Table 8 presents the lens prescriptions for the embodiment illustrated in FIG. 8.

| Surf | Radius | Thickness | Glass |
|---|---|---|---|
| OBJ | Infinity | 0.300 | Water |
| 1 | Infinity | 20.000 | Fused Silica |
| 2 | −27.327 | −20.000 | MIRROR |
| 3 | Infinity | 20.000 | MIRROR |
| 4 | −27.327 | 1.794 | |
| 5 | −39.715 | 3.764 | Fused Silica |
| 6 | −8.342 | 0.100 | |
| 7 | −738.367 | 3.000 | Fused Silica |
| 8 | −11.111 | 11.619 | |
| 9 | −25.780 | 2.000 | Fused Silica |
| 10 | 73.746 | 2.000 | |
| 11 | −24.538 | 3.000 | Fused Silica |
| 12 | −13.563 | 0.100 | |
| 13 | −69.503 | 3.500 | Fused Silica |
| 14 | −21.050 | 0.100 | |
| 15 | 190.339 | 3.500 | Fused Silica |
| 16 | −38.118 | 3.500 | |
| 17 | −16.248 | 1.250 | Fused Silica |
| 18 | −32.682 | 0.500 | |
| 19 | 29.047 | 5.000 | Fused Silica |
| 20 | −64.320 | 0.100 | |
| 21 | 17.773 | 4.500 | Fused Silica |
| 22 | 63.035 | 0.100 | |
| 23 | 11.282 | 10.391 | Fused Silica |
| 24 | 3.965 | 4.135 | |
| 25 | −4.742 | 2.227 | Fused Silica |
| 26 | −6.335 | 31.383 | |
| 27 | −96.596 | 3.500 | Fused Silica |
| 28 | −17.176 | 0.136 | |
| 29 | 44.760 | 3.500 | Fused Silica |
| 30 | −39.606 | 35.327 | |
| STO | Infinity | 0.000 | |
| IMA | Infinity | | |

In the design presented in FIG. 8, the numerical aperture may approach or even exceed approximately 0.97 in air. From FIG. 8, the focusing lens group 801 has the ability to receive light energy and transmit focused light energy. The field lens group 802 has the ability to receive the focused light energy and provide intermediate light energy, and form intermediate image 821. The catadioptric group or Mangin mirror arrangement 803 receives the intermediate energy and provides controlled light energy to the specimen 819 in a fluid 820 such as water. Alternately, the reflected path originates at the specimen 819, and light reflected from the specimen is received by the catadioptric group or Mangin mirror arrangement 803 and forms and transmits reflected light energy. The field lens group 802 receives the reflected light energy and transmitting resultant light energy, and the focusing lens group receives resultant light energy and transmits focused resultant light energy. An aperture or mask can be placed at the aperture stop 804 to limit or modify the NA of the objective.

The design of FIG. 8 operates at a 266 nm wavelength and has a field size of approximately 0.4 mm. The maximum element diameter is 30 mm. The small size of this objective is particularly beneficial in view of the performance characteristics of the objective. This ultra-high NA objective of FIG. 8 supports a numerical aperture of approximately 0.97 in water and a polychromatic wavefront error of less than approximately 0.035 waves.

The highest sensitivity to a 10 micron element decenter in the focusing group 801 is approximately 0.215 waves at 266 nm without compensation. The sensitivity to a 10 micron element decenter for the field lens group 802 is approximately 0.25 waves at 266 nm without compensation. The highest sensitivity to a 10 micron element decenter for the catadioptric group 803 is approximately 0.30 waves at 266 nm without compensation. These tolerances are relatively loose. This design also has an external pupil 804 for placing an aperture to control the NA, Fourier filtering, or dark-field applications.

The design presented in FIG. 8 and Table 8 thus uses a single glass material, fused silica. Other materials may be employed in a similar fashion to the design presented in FIG. 1. Re-optimization for other wavelengths requires slight tuning or altering of components, and may generally be within the abilities of those skilled in the art. The design of FIG. 8 is self corrected in a manner similar to the design of FIG. 1. Also, the ultra-high NA objective design presented herein can support various modes of illumination and imaging in a manner similar to the design of FIG. 1.

Figure 9:
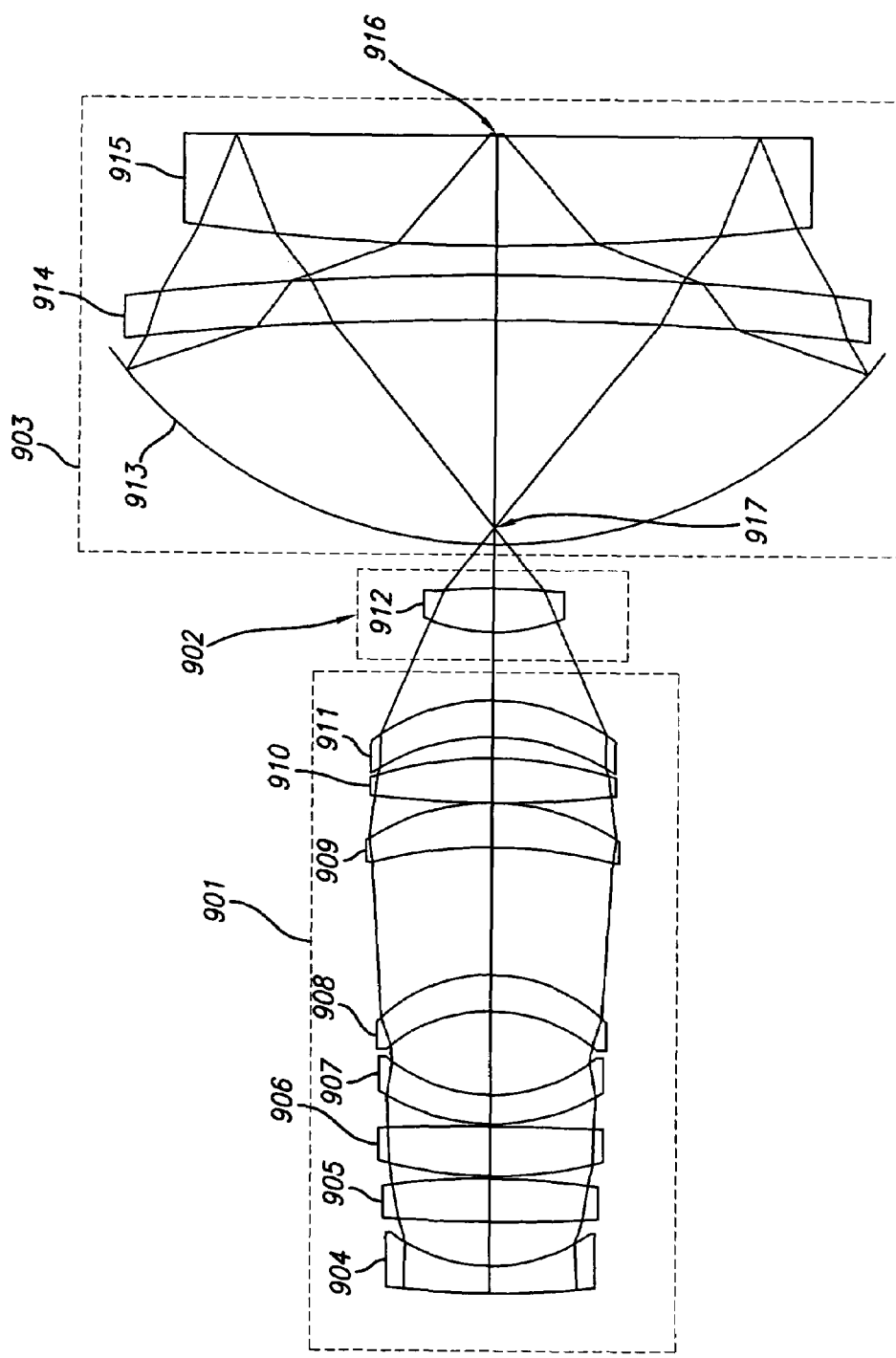
FIG. 9 presents a twelve element objective with a 0.97 NA having a field size of approximately 2.0 mm and a negative lens element inside the catadioptric group.

FIG. 9 illustrates an alternate embodiment according to the present design with twelve separate elements. This design has a different arrangement for the elements in the catadioptric group. This arrangement positions the lens between the spherical mirror and the Mangin element to have nearly zero power, where the lens is shaped as a meniscus element toward the spherical mirror. This is similar to the design in FIG. 1, with a similar ultra high NA but with larger diameter elements and a larger field size. The meniscus lens can be a parallel plate in this example.

The design comprises a focusing lens group 901, a field lends group 902, and a catadioptric group 903. The focusing lens group 901 includes lenses 904-911. Intermediate image 917 is formed by first lens group 901. The design further includes field lens 912 between the focusing lens group 901 and the intermediate image 917. The intermediate image 917 is formed in proximity to the vertex of the spherical mirror 913 in catadioptric group 903. The catadioptric group comprises three elements including a spherical mirror 913, lens element 914 used in triple pass, and a mangin element 915. The three element arrangement for the catadioptric group 903 places the lens 914 between the spherical mirror 913 and the Mangin element 915. This lens is shaped as a meniscus element toward the spherical mirror.

Table 9 represents the lens prescriptions for the embodiment illustrated in FIG. 9.

TABLE 9

Lens Prescriptions for the Design of FIG. 9

| Surf | Radius | Thickness | Glass |
|---|---|---|---|
| OBJ | Infinity | Infinity | |
| 1 | 122.274 | 3.750 | Fused Silica |
| 2 | 21.831 | 6.000 | |
| 3 | 201.419 | 6.000 | Fused Silica |
| 4 | −95.809 | 0.300 | |
| 5 | 57.148 | 6.750 | Fused Silica |
| 6 | −459.787 | 0.300 | |
| 7 | 27.916 | 4.000 | Fused Silica |
| 8 | 22.298 | 11.408 | |
| 9 | −21.925 | 5.000 | Fused Silica |
| 10 | −21.671 | 17.531 | |
| 11 | −63.955 | 6.000 | Fused Silica |
| 12 | −31.122 | 0.100 | |
| 13 | Infinity | 0.000 | |
| 14 | 150.035 | 6.000 | Fused Silica |
| 15 | −53.788 | 2.965 | |
| 16 | −29.055 | 5.000 | Fused Silica |
| 17 | −26.898 | 9.384 | |
| 18 | 24.585 | 6.000 | Fused Silica |
| 19 | −80.461 | 5.999 | |
| 20 | Infinity | 30.590 | |
| 21 | −424.220 | 6.000 | Fused Silica |
| 22 | −401.074 | 4.086 | |
| 23 | 325.485 | 14.718 | Fused Silica |
| 24 | Infinity | −14.718 | MIRROR |
| 25 | 325.485 | −4.086 | |
| 26 | −401.074 | −6.000 | Fused Silica |
| 27 | −424.220 | −30.590 | |
| 28 | 64.605 | 30.590 | MIRROR |
| 29 | −424.220 | 6.000 | Fused Silica |
| 30 | −401.074 | 4.086 | |
| 31 | 325.485 | 14.718 | Fused Silica |
| 32 | Infinity | 0.300 | |
| IMA | Infinity | | |

In the design presented in FIG. 9, the numerical aperture may approach or even exceed approximately 0.97 in air. From FIG. 9, the focusing lens group 901 has the ability to receive light energy and transmit focused light energy. The field lens group 902 has the ability to receive the focused light energy and provide intermediate light energy, and form intermediate image 917. The catadioptric group or Mangin mirror arrangement 903 receives the intermediate energy and provides controlled light energy to the focal point 916 and specimen (not shown). Alternately, the reflected path originates at the specimen, and light reflected from the specimen is received by the catadioptric group or Mangin mirror arrangement 903 and forms and transmits reflected light energy. The field lens group 902 receives the reflected light energy and transmitting resultant light energy, and the focusing lens group receives resultant light energy and transmits focused resultant light energy. An aperture or mask can be placed at the aperture stop (not shown) to limit or modify the NA of the objective.

The design of FIG. 9 operates at a 266 nm wavelength and has a field size of approximately 2.0 mm. The maximum element diameter is 104 mm and the ultra-high NA objective supports a numerical aperture of approximately 0.97 in air and a polychromatic wavefront error of less than approximately 0.055 waves.

The three element catadioptric arrangement 903 allows the objective to simultaneously achieve the above performance goals with very loose tolerances. The highest sensitivity to a 10 micron element decenter in the focusing group 901 is 0.40 waves at 266 nm without compensation. The sensitivity to a 10 micron element decenter for the field lens group 902 is 0.269 waves at 266 nm without compensation. The highest sensitivity to a 10 micron element decenter for the catadioptric group 903 is 0.34 waves at 266 nm without compensation.

The design presented in FIG. 9 and Table 9 thus uses a single glass material, fused silica. Other materials may be employed in a similar fashion to the design presented in FIG.

1. Re-optimization for other wavelengths requires slight tuning or altering of components, and may generally be within the abilities of those skilled in the art. The design of FIG. 9 is self corrected in a manner similar to the design of FIG. 1. Also, the ultra-high NA objective design presented herein can support various modes of illumination and imaging in a manner similar to the objective of FIG. 1.

Figure 10:
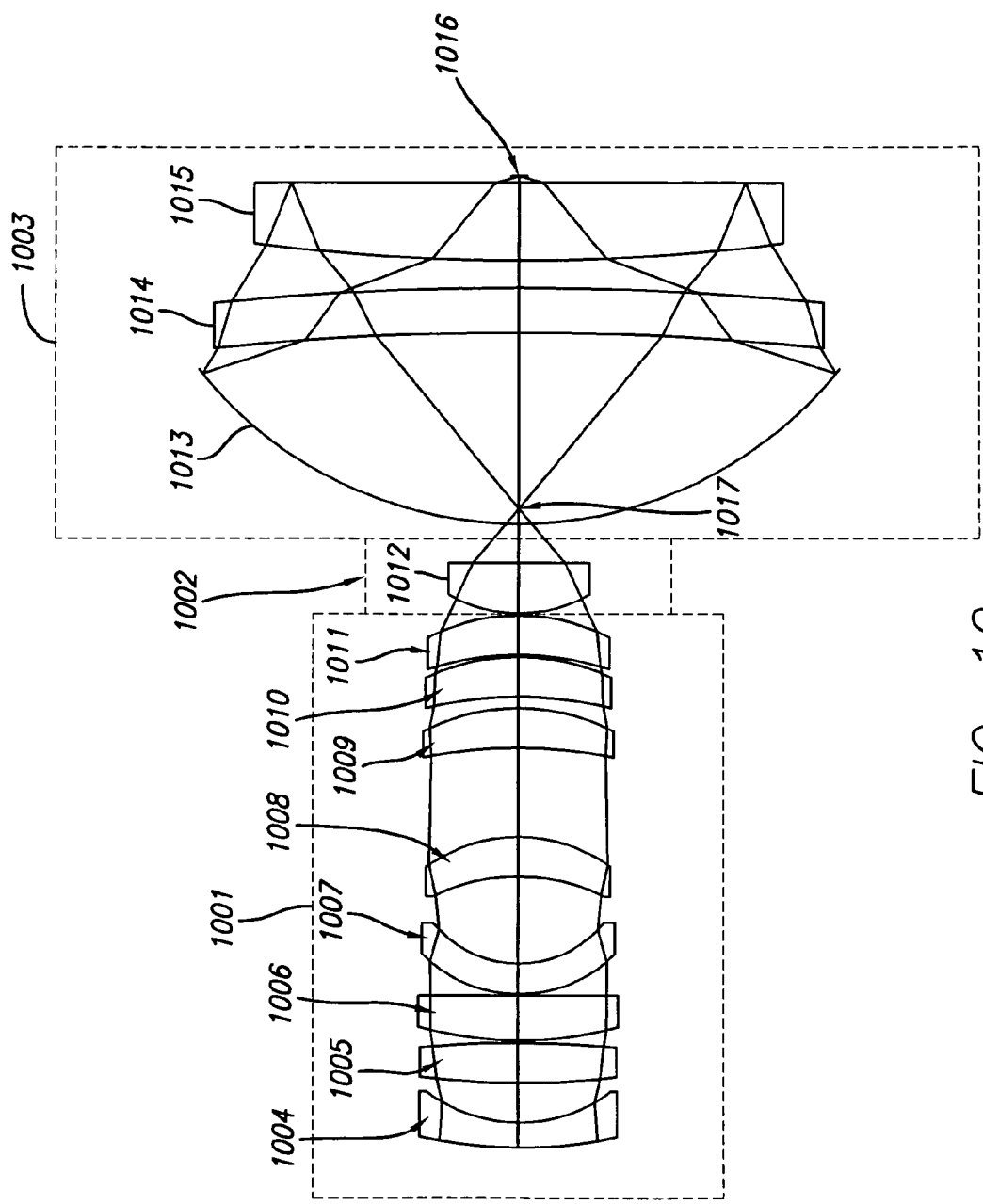
FIG. 10 illustrates a twelve element objective with a 0.97 NA having a field size of approximately 0.8 mm, a central wavelength of 213 nm, and a negative lens element inside the catadioptric group.

FIG. 10 illustrates an alternate embodiment according to the present design with twelve separate elements. This design has a similar arrangement to the design in FIG. 1 for the elements in the catadioptric group. This arrangement has the lens between the spherical mirror and the Mangin element, where the lens has nearly zero power and is shaped as a meniscus element toward the spherical mirror. The meniscus lens can again be a parallel plate for this example.

The design comprises a focusing lens group 1001, a field lens group 1002, and a catadioptric group 1003. The focusing lens group 1001 includes lenses 1004-1011. Intermediate image 1017 is formed by first lens group 1001. The design further includes field lens 1012 between the focusing lens group 1001 and the intermediate image 1017. The intermediate image 1017 is formed in proximity to the vertex of the spherical mirror 1013 in catadioptric group 1003. The catadioptric group comprises three elements including a spherical mirror 1013, lens element 1014 used in triple pass, and a mangin element 1015. The three element arrangement for the catadioptric group 1003 places the lens 1014 between the spherical mirror 1013 and the Mangin element 1015, where lens 1014 is shaped as a meniscus element toward the spherical mirror.

Table 10 presents the lens prescriptions for the embodiment illustrated in FIG. 10.

TABLE 10

Lens Prescriptions for the design of FIG. 10

| Surf | Radius | Thickness | Glass |
|---|---|---|---|
| OBJ | Infinity | Infinity | |
| 3 | 22.471 | 1.250 | Fused silica |
| 4 | 7.395 | 2.000 | |
| 6 | 39.732 | 2.000 | Fused silica |
| 7 | −52.562 | 0.100 | |
| 9 | 17.947 | 2.250 | Fused silica |
| 10 | 8869.500 | 0.100 | |
| 12 | 6.686 | 1.500 | Fused silica |
| 13 | 5.427 | 4.362 | |
| 15 | −9.580 | 2.001 | Fused silica |
| 16 | −7.651 | 4.474 | |
| 18 | −23.309 | 2.000 | Fused silica |
| 19 | −10.088 | 0.566 | |
| 21 | −18.544 | 2.000 | Fused silica |
| 22 | −10.746 | 0.100 | |
| 24 | −14.286 | 2.000 | Fused silica |
| 25 | −9.423 | 0.100 | |
| 27 | 7.162 | 2.500 | Fused silica |
| 28 | 261.022 | 1.999 | |
| 30 | Infinity | 9.522 | |
| 32 | −141.985 | 2.253 | Fused silica |
| 33 | −141.433 | 1.364 | |
| 35 | 106.906 | 3.872 | Fused silica |
| 36 | Infinity | −3.872 | MIRROR |
| 37 | 106.906 | −1.364 | |
| 39 | −141.433 | −2.253 | Fused silica |
| 40 | −141.985 | −9.522 | |
| 42 | 19.985 | 9.522 | MIRROR |
| 43 | −141.985 | 2.253 | Fused silica |
| 44 | −141.433 | 1.364 | |
| 46 | 106.906 | 3.872 | Fused silica |
| 47 | Infinity | 0.300 | |
| IMA | Infinity | | |

In the design presented in FIG. 10, the numerical aperture may approach or even exceed approximately 0.97 in air. From FIG. 10, the focusing lens group 1001 has the ability to receive light energy and transmit focused light energy. The field lens group 1002 has the ability to receive the focused light energy and provide intermediate light energy, and form intermediate image 1017. The catadioptric group or Mangin mirror arrangement 1003 receives the intermediate energy and provides controlled light energy to the focal point 1016 and the specimen (not shown). Alternately, the reflected path originates at the specimen, and light reflected from the specimen is received by the catadioptric group or Mangin mirror arrangement 1003 and forms and transmits reflected light energy. The field lens group 1002 receives the reflected light energy and transmitting resultant light energy, and the focusing lens group receives resultant light energy and transmits focused resultant light energy. An aperture or mask can be placed at the aperture stop (not shown) to limit or modify the NA of the objective.

The design of FIG. 10 operates at a 213 nm wavelength and has a field size of approximately 0.8 mm. The maximum element diameter is 31.5 mm. As a result, the objective can be mounted in a standard microscope turret with an approximate 45 mm flange-to-object separation. This ultra-high NA objective supports a numerical aperture of approximately 0.97 in air and a polychromatic wavefront error of less than approximately 0.05 waves.

The three element catadioptric arrangement 1003 provides generally loose tolerances. The highest sensitivity to a 10 micron element decenter in the focusing group 1001 is approximately 0.4469 waves at 213 nm without compensation. The sensitivity to a 10 micron element decenter for the field lens group 1002 is approximately 0.4387 waves at 213 nm without compensation. The highest sensitivity to a 10 micron element decenter for the catadioptric group 1003 is approximately 0.463 waves at 213 nm without compensation.

The design presented in FIG. 10 and Table 10 uses a single glass material, fused silica. Other materials may be employed in a similar fashion to the design presented in FIG. 1. Re-optimization for other wavelengths requires slight tuning or altering of components, and may generally be within the abilities of those skilled in the art. The design of FIG. 10 is self corrected in a manner similar to the design of FIG. 1. The ultra-high NA objective design presented in FIG. 10 can support various modes of illumination and imaging in a manner similar to the objective in FIG. 1.

Figure 11:
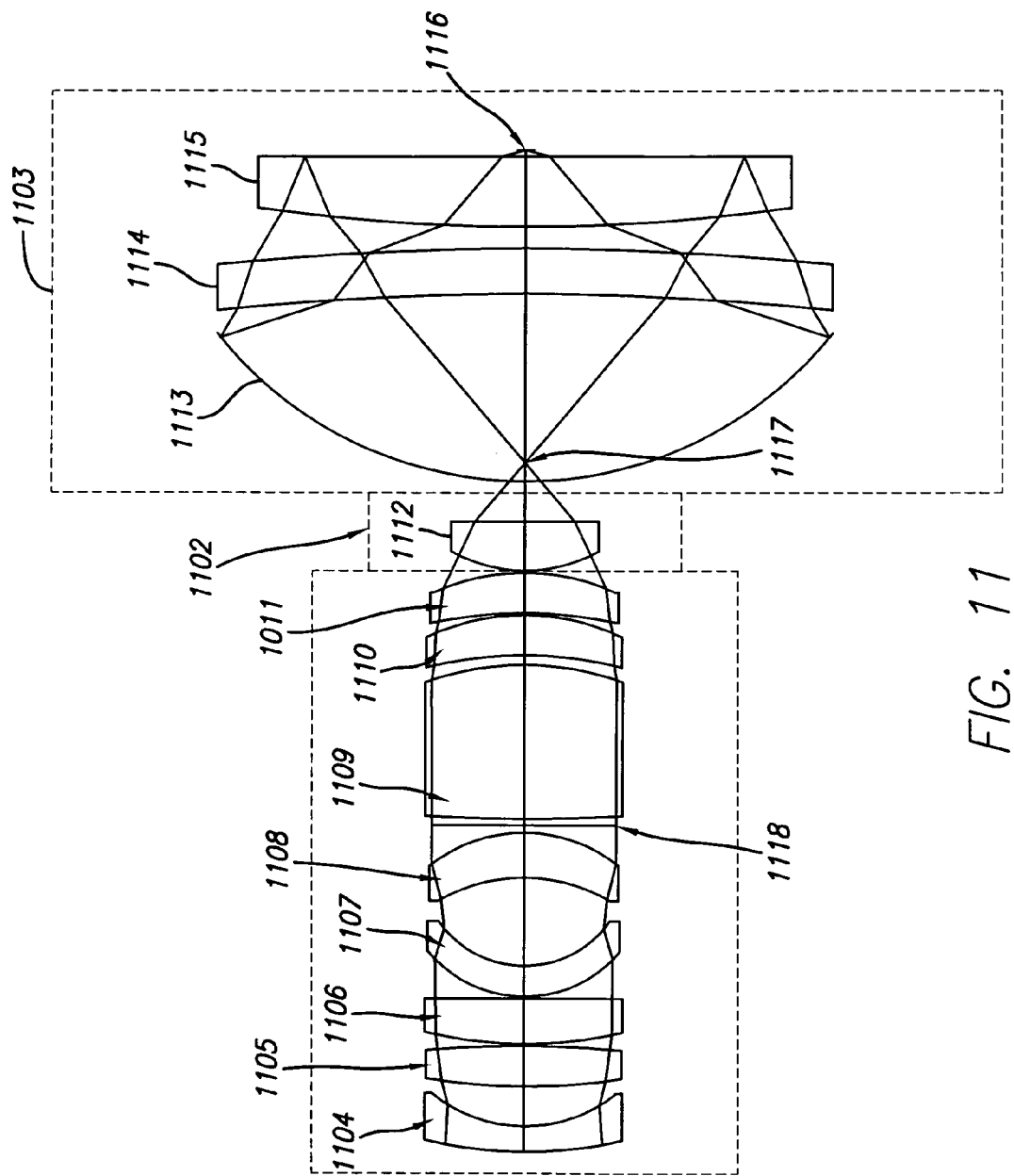
FIG. 11 represents a twelve element objective with a 0.97 NA having a field size of approximately 1.0 mm and a negative lens element inside the catadioptric group.

FIG. 11 illustrates an alternate embodiment according to the present design with twelve separate elements. This design has a similar arrangement to the design in FIG. 1 for the elements in the catadioptric group. The arrangement of FIG. 11 once again positions the lens between the spherical mirror and the Mangin element, thereby providing nearly zero power, where the lens is shaped as a meniscus element toward the spherical mirror. Again, the meniscus lens can be a parallel plate for this example.

The design comprises a focusing lens group 1101, a field lens group 1102, and a catadioptric group 1103. The focusing lens group 1101 includes lenses 1104-1111. Intermediate image 1117 is formed by first lens group 1101. The design further includes field lens 1112 between the focusing lens group 1101 and the intermediate image 1117. The intermediate image 1117 is formed in proximity to the vertex of the spherical mirror 1113 in catadioptric group 1103. The catadioptric group comprises three elements including a spherical mirror 1113, lens element 1114 used in triple pass, and a mangin element 1115. The three element arrangement for the catadioptric group 1103 places the lens 1114 between the spherical mirror 1113 and the Mangin element 1115. This lens 1114 is shaped as a meniscus element toward the spherical mirror.

Table 11 presents the lens prescriptions for the embodiment illustrated in FIG. 11.

TABLE 11

Lens Prescriptions for the design of FIG. 11

| Surf | Radius | Thickness | Glass |
|---|---|---|---|
| OBJ | Infinity | Infinity | |
| 1 | 27.479 | 1.563 | Fused silica |
| 2 | 9.002 | 2.500 | |
| 3 | 36.861 | 2.500 | Fused silica |
| 4 | −75.288 | 0.125 | |
| 5 | 25.832 | 2.813 | Fused silica |
| 6 | 1469.980 | 0.125 | |
| 7 | 7.763 | 1.874 | Fused silica |
| 8 | 6.480 | 5.516 | |
| 9 | −10.611 | 2.801 | Fused silica |
| 10 | −9.389 | 0.448 | |
| STO | Infinity | 0.417 | |
| 12 | 139.617 | 9.574 | Fused silica |
| 13 | −17.917 | 0.625 | |
| 14 | −22.937 | 2.500 | Fused silica |
| 15 | −13.655 | 0.125 | |
| 16 | −26.113 | 2.500 | Fused silica |
| 17 | −13.608 | 0.125 | |
| 18 | 9.138 | 3.125 | Fused silica |
| 19 | −173.251 | 2.499 | |
| 20 | Infinity | 11.598 | |
| 21 | −166.466 | 2.813 | Fused silica |
| 22 | −172.097 | 1.316 | |
| 23 | 112.593 | 4.359 | Fused silica |
| 24 | Infinity | −4.359 | MIRROR |
| 25 | 112.593 | −1.316 | |
| 26 | −172.097 | −2.813 | Fused silica |
| 27 | −166.466 | −11.598 | |
| 28 | 23.807 | 11.598 | MIRROR |
| 29 | −166.466 | 2.813 | Fused silica |
| 30 | −172.097 | 1.316 | |
| 31 | 112.593 | 4.359 | Fused silica |
| 32 | Infinity | 0.375 | |
| IMA | Infinity | | |

In the design presented in FIG. 11, the numerical aperture may approach or even exceed approximately 0.97 in air. From FIG. 11, the focusing lens group 1101 has the ability to receive light energy and transmit focused light energy. The field lens group 1102 has the ability to receive the focused light energy and provide intermediate light energy, and form intermediate image 1117. The catadioptric group or Mangin mirror arrangement 1103 receives the intermediate energy and provides controlled light energy to the focal point 1116 and specimen (not shown). Alternately, the reflected path originates at the specimen, and light reflected from the specimen is received by the catadioptric group or Mangin mirror arrangement 1103 and forms and transmits reflected light energy. The field lens group 1102 receives the reflected light energy and transmitting resultant light energy, and the focusing lens group receives resultant light energy and transmits focused resultant light energy. An aperture or mask can be placed at the aperture stop 1118 to limit or modify the NA of the objective.

The design of FIG. 11 operates at a 266 nm wavelength and has a field size of approximately 1.0 mm. The maximum element diameter is 37 mm, and the ultra-high NA objective of FIG. 11 supports a numerical aperture of approximately 0.97 in air and a polychromatic wavefront error of less than approximately 0.05 waves.

The three element catadioptric arrangement 1103 has relatively loose tolerances. The highest sensitivity to a 10 micron element decenter in the focusing group 1101 is approximately 0.38 waves at 266 nm without compensation. The sensitivity to a 10 micron element decenter for the field lens group 1102 is approximately 0.32 waves at 266 nm without compensation. The highest sensitivity to a 10 micron element decenter for the catadioptric group 1103 is approximately 0.41 waves at 266 nm without compensation.

The design presented in FIG. 11 and Table 11 thus uses a single glass material, fused silica. Other materials may be employed as discussed in connection with the design presented in FIG. 1. Re-optimization for other wavelengths requires slight tuning or altering of components, and may generally be within the abilities of those skilled in the art. The design of FIG. 11 is again self corrected in a manner similar to the design of FIG. 1. The ultra-high NA objective design of FIG. 11 can support various modes of illumination and imaging in a manner similar to the objective of FIG. 1.

Figure 12:
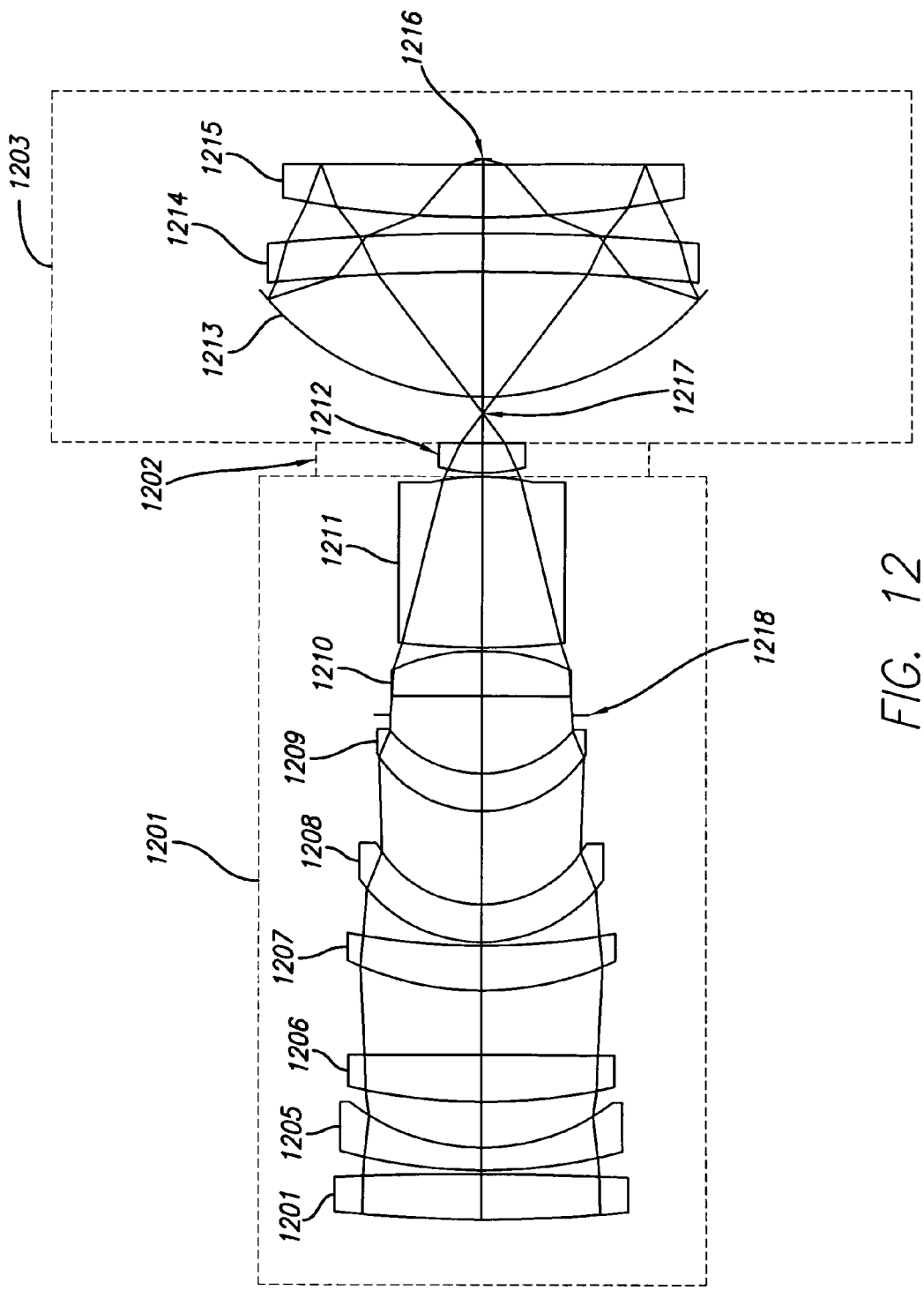
FIG. 12 presents a twelve element objective with a 0.97 NA having a field size of approximately 1.0 mm, a negative lens element inside the catadioptric group, and an extended length with reduced catadioptric element diameters.

FIG. 12 illustrates an alternate embodiment having twelve separate elements. This design has a similar arrangement to the design of FIG. 1 for elements in the catadioptric group. This arrangement positions the lens between the spherical mirror and the Mangin element to have nearly zero power, where the lens is again shaped as a meniscus element toward the spherical mirror. The meniscus lens can be a parallel plate. This design employs a relatively longer focusing lens group with a smaller diameter catadioptric group as compared to the design of FIG. 11.

The design comprises a focusing lens group 1201, a field lens group 1202, and a catadioptric group 1203. The focusing lens group 1201 includes lenses 1204-1211. Intermediate image 1217 is formed by first lens group 1201. The design further includes field lens 1212 between the focusing lens group 1201 and the intermediate image 1217. The intermediate image 1217 is formed in proximity to the vertex of the spherical mirror 1213 in catadioptric group 1203. The catadioptric group comprises three elements including a spherical mirror 1213, lens element 1214 used in triple pass, and a mangin element 1215. The three element arrangement for the catadioptric group 1203 places the lens 1214 between the spherical mirror 1213 and the Mangin element 1215, where lens 1214 is shaped as a meniscus element toward the spherical mirror.

Table 12 presents the lens prescriptions for the embodiment illustrated in FIG. 12.

TABLE 12

Lens Prescriptions for the design of FIG. 12

| Surf | Radius | Thickness | Glass |
|---|---|---|---|
| OBJ | Infinity | Infinity | |
| 1 | 95.881 | 3.000 | Fused silica |
| 2 | −222.514 | 0.250 | |
| 3 | 35.188 | 1.500 | Fused silica |
| 4 | 13.819 | 3.000 | |
| 5 | 38.675 | 3.000 | Fused silica |
| 6 | 514.805 | 4.321 | |
| 7 | 20.381 | 3.000 | Fused silica |
| 8 | 46.874 | 0.250 | |
| 9 | 9.745 | 2.500 | Fused silica |
| 10 | 7.867 | 6.168 | |
| 11 | 8.053 | 2.500 | Fused silica |
| 12 | 7.732 | 3.863 | |
| STO | Infinity | 1.280 | |
| 14 | −578.786 | 3.000 | Fused silica |
| 15 | −14.400 | 0.250 | |
| 16 | 51.780 | 11.257 | Fused silica |
| 17 | −14.562 | 0.250 | |
| 18 | 10.115 | 2.000 | Fused silica |
| 19 | −26.769 | 3.000 | |

TABLE 12-continued

Lens Prescriptions for the design of FIG. 12

| Surf | Radius | Thickness | Glass |
|---|---|---|---|
| 20 | Infinity | 8.250 | |
| 21 | −123.061 | 2.500 | Fused silica |
| 22 | −137.847 | 1.065 | |
| 23 | 71.249 | 3.447 | Fused silica |
| 24 | Infinity | −3.447 | MIRROR |
| 25 | 71.249 | −1.065 | |
| 26 | −137.847 | −2.500 | Fused silica |
| 27 | −123.061 | −8.250 | |
| 28 | 18.535 | 8.250 | MIRROR |
| 29 | −123.061 | 2.500 | Fused silica |
| 30 | −137.847 | 1.065 | |
| 31 | 71.249 | 3.447 | Fused silica |
| 32 | Infinity | 0.350 | |
| IMA | Infinity | | |

In the design presented in FIG. 12, the numerical aperture may approach or even exceed approximately 0.97 in air. From FIG. 12, the focusing lens group 1201 has the ability to receive light energy and transmit focused light energy. The field lens group 1202 has the ability to receive the focused light energy and provide intermediate light energy, and form intermediate image 1217. The catadioptric group or Mangin mirror arrangement 1203 receives the intermediate energy and provides controlled light energy to the focal point 1216 and the specimen (not shown). Alternately, the reflected path originates at the specimen, and light reflected from the specimen is received by the catadioptric group or Mangin mirror arrangement 1203 and forms and transmits reflected light energy. The field lens group 1202 receives the reflected light energy and transmitting resultant light energy, and the focusing lens group receives resultant light energy and transmits focused resultant light energy. An aperture or mask can be placed at the aperture stop 1218 to limit or modify the NA of the objective.

The design of FIG. 12 operates at a 266 nm wavelength and has a field size of approximately 1.0 mm. The maximum element diameter is 28 mm, and this small element diameter as compared to the design in FIG. 11 is achieved due to the extended length of the focusing group. The small size of this objective is particularly beneficial in view of the performance characteristics of the objective. This ultra-high NA objective supports a numerical aperture of approximately 0.97 in air and a polychromatic wavefront error of less than approximately 0.05 waves.

The three element catadioptric arrangement 1203 provides relatively loose tolerances. The highest sensitivity to a 10 micron element decenter in the focusing group 1201 is approximately 0.40 waves at 266 nm without compensation. The sensitivity to a 10 micron element decenter for the field lens group 1202 is approximately 0.31 waves at 266 nm without compensation. The highest sensitivity to a 10 micron element decenter for the catadioptric group 1103 is approximately 0.47 waves at 266 nm without compensation.

The design presented in FIG. 12 and Table 12 thus uses a single glass material, fused silica. Other materials may be employed in a similar fashion to the design presented in FIG. 1. Re-optimization for other wavelengths requires slight tuning or altering of components, and may generally be within the abilities of those skilled in the art. The design of FIG. 12 is self corrected in a manner similar to the design of FIG. 1. The ultra-high NA objective design presented in FIG. 12 can support various modes of illumination and imaging such as those listed in connection with the objective in FIG. 1.

The present system design may be employed in various environments, including but not limited to lithography, microscopy, biological inspection, medical research, and the like.

The design presented herein and the specific aspects illustrated are meant not to be limiting, but may include alternate components while still incorporating the teachings and benefits of the invention, namely an ultra-high numerical aperture objective for use in imaging a specimen. While the invention has thus been described in connection with specific embodiments thereof, it will be understood that the invention is capable of further modifications. This application is intended to cover any variations, uses or adaptations of the invention following, in general, the principles of the invention, and including such departures from the present disclosure as come within known and customary practice within the art to which the invention pertains.

What is claimed is:

1. An ultra-high numerical aperture objective for use in imaging a specimen, comprising:
    a lens group comprising at least one focusing lens configured to receive light energy and form focused light energy, said focused light energy forming an intermediate image;
    a field lens arrangement comprising at least one field lens located in proximity to the intermediate image; and
    a catadioptric arrangement positioned between the field lens arrangement and the specimen and configured to receive the intermediate image and form controlled light energy, wherein the catadioptric arrangement comprises a spherical reflective surface, at least one Mangin element having a reflective surface exhibiting de minimis curvature and a meniscus lens element, the meniscus lens element free from direct contact with each Mangin element and oriented to have a meniscus surface having a meniscus surface radius of curvature substantially opposite in direction from a spherical surface radius of curvature of the spherical reflective surface.

2. The objective of claim 1 wherein wavefront error from any 10 micron element decenter is less than lambda/2.

3. The objective of claim 1 wherein wavefront error from any 10 micron element decenter is less than lambdal/3.

4. The objective of claim 1 wherein the meniscus lens element is positioned between the spherical reflective surface and the specimen.

5. The objective of claim 1 wherein refractive power of the catadioptric arrangement is at most zero.

6. The objective of claim 1 wherein the Mangin element includes a surface having a Mangin surface radius of curvature generally similar in direction to the spherical surface radius of curvature.

7. The objective of claim 1 wherein the meniscus lens element is curved away from the Mangin element.

8. The objective of claim 1 wherein the Mangin element comprises a surface having a radius of curvature between approximately 50 mm and infinity.

9. The objective of claim 1, wherein the objective supports a bandwidth of at least 0.050 nanometers around a central wavelength of 266 nanometers.

10. The objective of claim 1, wherein the objective exhibits a polychromatic Strehl ratio greater than approximately 0.9 at a field of the objective.

11. The objective of claim 1, wherein the objective supports a numerical aperture of at least 0.97.

12. The objective of claim 1, wherein field size to largest element diameter ratio is at least 0.03.

13. The objective of claim 1, wherein the objective is self corrected.

14. The objective of claim 1, wherein at least one field lens is positioned between the intermediate image and the catadioptric arrangement.

15. The objective of claim 1, wherein the objective exhibits a central wavelength in the range of 193 to 355 nanometers.

16. The objective of claim 1 where the objective is composed of a single glass material.

17. The objective of claim 16 where the glass material is fused silica.

18. The objective of claim 16 where the glass material is calcium fluoride.

19. An ultra-high numerical aperture objective for use in imaging a specimen, comprising:
   a plurality of lenses comprising at least one focusing lens configured to receive light energy and form focused light energy, said focused light energy forming an intermediate image;
   a field lens arrangement comprising at least one field lens located in proximity to the intermediate image; and
   a catadioptric arrangement positioned between the field lens arrangement and the specimen and configured to receive the intermediate light energy and form controlled light energy, wherein the catadioptric arrangement comprises a plurality of reflecting surfaces including at least one spherical reflecting surface and at least one reflecting surface exhibiting de minimis curvature and a meniscus lens, the meniscus lens free from direct contact with every reflecting surface and oriented to have a meniscus surface having a meniscus surface radius of curvature substantially opposite in direction from a spherical surface radius of curvature of at least one spherical reflecting surface.

20. The objective of claim 19 wherein the meniscus lens is positioned between at least one spherical reflecting surface within the catadioptric arrangement and the specimen.

21. The objective of claim 19 wherein refractive power of the catadioptric arrangement is at most zero.

22. The objective of claim 19 wherein one reflecting surface comprises a curved reflecting surface and the meniscus lens element is curved toward the curved reflecting surface.

23. The objective of claim 19 wherein one reflecting surface comprises a curved reflecting surface.

24. The objective of claim 19, wherein the objective is self corrected.

25. The objective of claim 19 where the objective is composed of a single glass material.

26. An objective comprising:
   focusing means for receiving light energy and forming focused light energy, said focused light energy forming an intermediate image;
   a field lens arrangement comprising at least one field lens located in proximity to the intermediate image; and
   controlled means positioned proximate the field lens arrangement on a side opposite the focusing means for receiving the intermediate image and form controlled light energy, wherein the controlled means comprises a spherical reflective surface, at least one Mangin element having an uncurved reflective surface and at least one Mangin element having an uncurved reflective surface and a meniscus lens element, the meniscus lens element free from direct contact with each Mangin element and oriented to have a meniscus surface radius of curvature of at least one surface substantially opposite in direction from a spherical surface radius of curvature of the spherical reflective surface.

27. The objective of claim 26 wherein the controlled means further comprises a substantially flat element.

28. The objective of claim 26 wherein refractive power of the controlled means is at most zero.

29. The objective of claim 26 wherein the Mangin element includes a surface having a Mangin surface radius of curvature substantially similar in direction to the spherical surface radius of curvature.

30. The objective of claim 26, wherein the objective is self corrected.

31. The objective of claim 26, where the objective is composed of a single glass material.

* * * * *